United States Patent [19]

Daniels et al.

[11] Patent Number: 4,860,290
[45] Date of Patent: Aug. 22, 1989

[54] LOGIC CIRCUIT HAVING INDIVIDUALLY TESTABLE LOGIC MODULES

[75] Inventors: Martin D. Daniels, Houston, Tex.; Derek Roskell, Northants, England

[73] Assignee: Texas Instruments Incorporated, Dallas, Tex.

[21] Appl. No.: 57,078

[22] Filed: Jun. 2, 1987

[51] Int. Cl.$^4$ .............................................. G01R 31/28
[52] U.S. Cl. ..................................................... 371/25
[58] Field of Search ................. 371/25, 15; 324/73 R, 324/73 AT

[56] References Cited

U.S. PATENT DOCUMENTS

| | | | |
|---|---|---|---|
| 4,597,042 | 6/1986 | d'Angeac | 364/200 |
| 4,698,588 | 10/1987 | Huang | 371/25 X |
| 4,701,921 | 10/1987 | Powell | 371/25 |
| 4,710,931 | 12/1987 | Bellay | 371/25 |
| 4,710,933 | 12/1987 | Powell | 371/25 |

OTHER PUBLICATIONS

E. J. McCluskey, "A Survey of Design for Testability Scan Techniques", VLSI Design, 12/1984 pp. 38–61.

*Primary Examiner*—Jerry Smith
*Assistant Examiner*—Robert W. Beausoliel
*Attorney, Agent, or Firm*—Lawrence J. Bassuk; Thomas W. DeMond; Melvin Sharp

[57] ABSTRACT

A modular logic circuit is disclosed, where each of the modules may be selected for testing by means of a scan path within the module made up of serial register latches (SRLs), each SRL being connected to predetermined nodes in the module functional circuitry. Each of the modules has a test port, which is independent from the system bus interconnections in the logic circuit, and which has an SRL for receiving serial data for selection of the scan path within the module. Responsive to the logic state stored in a module's selection SRL, the scan path within the module will either be enabled or disabled. After selection of a module or modules for testing, serial data is scanned into the SRLs in the scan path for setting the associated predetermined functional circuitry nodes; after exercise of the functional circuitry, the SRLs in the scan path store the results of the exercise at the predetermined nodes. An additional SRL is contained within each test port, and in the scan path, for storing a logic state corresponding to whether the functional circuitry in the module is to be connected to or disconnected from the system bus during the test sequence. A configuration if further disclosed which has global SRLs in the modules; such global SRLs are always in the scan path, regardless of whether or not the module containing them is selected. Multiplexing of the scan data and the configuration data is also disclosed.

35 Claims, 12 Drawing Sheets

LOGIC CIRCUIT HAVING INDIVIDUALLY TESTABLE LOGIC MODULES

This application is in the field of electronic digital logic circuits, and specifically is directed to circuits which enhance the testability of such logic circuits.

As the technology for manufacturing integrated circuits advances, more and more logic functions may be included in a single integrated circuit device. Modern integrated circuit devices include over 100,000 transistors on a single semiconductor chip, with these transistors interconnected so as to perform multiple and complex functions such as those in a general-purpose microprocessor. The manufacture of such circuits incorporating such Very Large Scale Integration (VLSI) requires, however, that no errors exist in the design of the circuit, and that no manufacturing defect was generated during its manufacture, which preclude it from performing all of the functions that it is intended to perform. This requires verification of the designed circuit prior to its manufacture and also electrical testing of each manufactured circuit.

However, as the complexity of the circuit increases, so does the cost and difficulty of verifying and electrically testing each of the devices in the circuit. From an electrical test standpoint, in order to totally verify that each of the transistors in the VLSI circuit properly function, one must theoretically be able to exercise each of the transistors not only individually (in the digital sense, determining that it is neither stuck-open or stuck-closed), but also in conjunction with the other transistors in the circuit in all possible combinations of operation. In addition, specific circuit configurations in the VLSI circuit may have some of its transistors inaccessible for all but a special combination, thereby hiding a fault unless a very specific pattern of signals is presented. However, the cost of performing such testing on 100% of the manufactured circuits is staggering, considering the high cost of the test equipment required to exercise each circuit in conjunction with the long time required to present each possible combination to each transistor. This has in the past forced integrated circuit manufacturers to test less than all of the active devices in a chip, with the quality levels of the product becoming less than optimal.

Circuit designers have used stuck-fault modeling techniques in improving the efficiency of the testing of such VLSI circuits. Stuck-fault modeling is directed not to stuck-open or stuck-closed defects in individual transistors, but to the effect of such defective transistors (and defective interconnections) resulting stuck-high and stuck-low outputs of the logic circuit. Minimum test patterns are then derived for the exercising of the logic circuit, such test patterns being inputs to the circuit designed to cause stuck-high and stuck-low outputs if defects are present. Such techniques have been successful in improving the test efficiency of VLSI circuits.

In conjunction with the stuck-fault modeling and associated pattern generation, cooperative circuitry may be included in the VLSI circuit specifically directed to improving its testability. One configuration of this cooperative circuitry is a scan path in the logic circuit. The scan path consists of a series of synchronously clocked master/slave latches, each of which is connected to a particular node in the logic circuit. These latches can be loaded with a serial data stream ("scan in") and can present their contents to the nodes in the logic circuit, presetting the logic circuit nodes to a predetermined state. The logic circuit then can be exercised in normal fashion, with the result of the operation at the latch nodes stored in the latches. By serially unloading the contents of the latches ("scan out"), the result of the operation at the associated nodes is read. Repetition of this operation with a number of different data patterns effectively tests all necessary combinations of the logic circuit, at reduced test time and cost. Techniques for scanning such data are discussed by E. J. McCluskey in "A Survey of Design for Testability Scan Techiques", VLSI Design (Vol. 5, No. 12, pp. 38–61, December 1984).

Also as this technology is advancing, users of integrated circuits are desiring specially designed and constructed integrated circuits, for performing functions specific for the user's application. The genre of such integrated circuits has been termed Application Specific Integrated Circuits (ASIC). For an ASIC device to be cost-competitive with general purpose microcomputers which may have the special function software programmable, and cost-competitive with a board design made up of smaller scale integrated circuits, the design time of the ASIC circuit must be short and the ASIC circuit must be manufacturable at a low cost. Accordingly, it is useful for such circuits to be modular in design, with each of the modules performing a certain function, so that a new circuit may be constructed for a specific purpose by the combining of previously-designed circuit modules. Such an approach can also be used for non-ASIC microcomputers and microprocessors. Regardless of the end product, the use of a modular approach allows the designer to use logic which has previously been verified, and already been proven as manufacturable. However, if logic modules which utilize a single scan path in their original placement in an integrated circuit, are placed into a new circuit application, new test patterns will be required for the new device, thereby lengthening the design/manufacture cycle time. In addition, the destruction of the original scan path may reduce the effectiveness of the scan path in the new device.

As described in patent numbers 4,710,933, 4,710,931, 4,701,921 and 4,698,588 all filed October 23, 1985 and all assigned to Texas Instruments Incorporated, a modular approach to utilizing scan paths and other testability circuits has been used and provides thorough coverage of all possible faults in an efficient manner. However, the described approach utilizes system buses to set up and operate the scan test, so that even though each of the modules is tested independently, the test pattern designed for a given module depends upon the operation of other modules in the logic circuit for purposes of bus control and module selection. This results in the testability of a particular module depending upon the fault-free operation of other modules. In addition, the test equipment computer program which sets the conditions for test of a given module depends upon the position of the module relative to other modules, and upon the operating features of such other modules. While reduced test time and cost are thus achieved by such modularity, the use of system buses to load and unload the scan paths in the individual modules not only may affect the operation of the particular module, but is likely to also preclude "porting" of the test pattern and program for a given module from one logic circuit to another.

It is therefore an object of this invention to provide a test port for a logic module, so that the test data and enabling of a scan path within the module may be made independent of the functional architecture of the logic circuit containing the module.

It is a further object of this invention to provide such a test port which provides isolation of the particular logic module from other modules during the test operation.

It is a further object of this invention to provide such a test port which allows enabling of the module's scan path without requiring the operation of other modules in the logic circuit.

It is a further object of this invention to provide such a test port which can allow enabling of the scan path within a module while other module scan paths are enabled.

It is a further object of this invention to provide such a test port which uses a single clock to load the scan paths in all modules having the port.

Other objects and advantages of this invention will be apparent to those of ordinary skill in this field, with reference to the following specification and accompanying drawings.

SUMMARY OF THE INVENTION

The invention may be incorporated into a logic circuit which is organized in a plurality of functional modules, and where communication among the modules occurs via a system bus. Testing of a functional module occurs through a scan path comprised of a series of data latches, each of the latches connected to a node in the functional circuitry. The scan paths of the modules are connected in a series among each other, so that a single dynamically configurable scan path exists in the logic circuit. Data is "scanned", or shifted, into the data latches for application to said functional circuitry nodes; after the operation of the functional circuitry, the latch data is scanned out for analysis of the results. The modules further comprise a module enable latch which, when loaded with a particular logic state, enables the scan path in the module. When the module is not selected, the scan path is bypassed, so that data may be scanned through the module to the selected module, without passing through the scan paths of the unselected modules. The module enable latches may themselves be interconnected into a scan path, separate from the data scan path, so that the function of enabling the modules may be done externally from the logic chip through a minimum of device pins, thereby not requiring intervention of other portions of the logic circuit (e.g., the CPU) in the selection of a module or modules for test. The module enable scan path may have a separate input and output from the data scan path, or it may be multiplexed with the data scan input and output of the device. During the testing of a given module, the test port can also be operable to disable the system bus from the functional circuitry in the module, so that control of the system bus by the CPU or another module is not required for performing the test function and so that the operation of unselected modules does not interfere with a module under test.

DETAILED DESCRIPTION OF THE PREFERRED EMBODIMENTS

Figure 1:
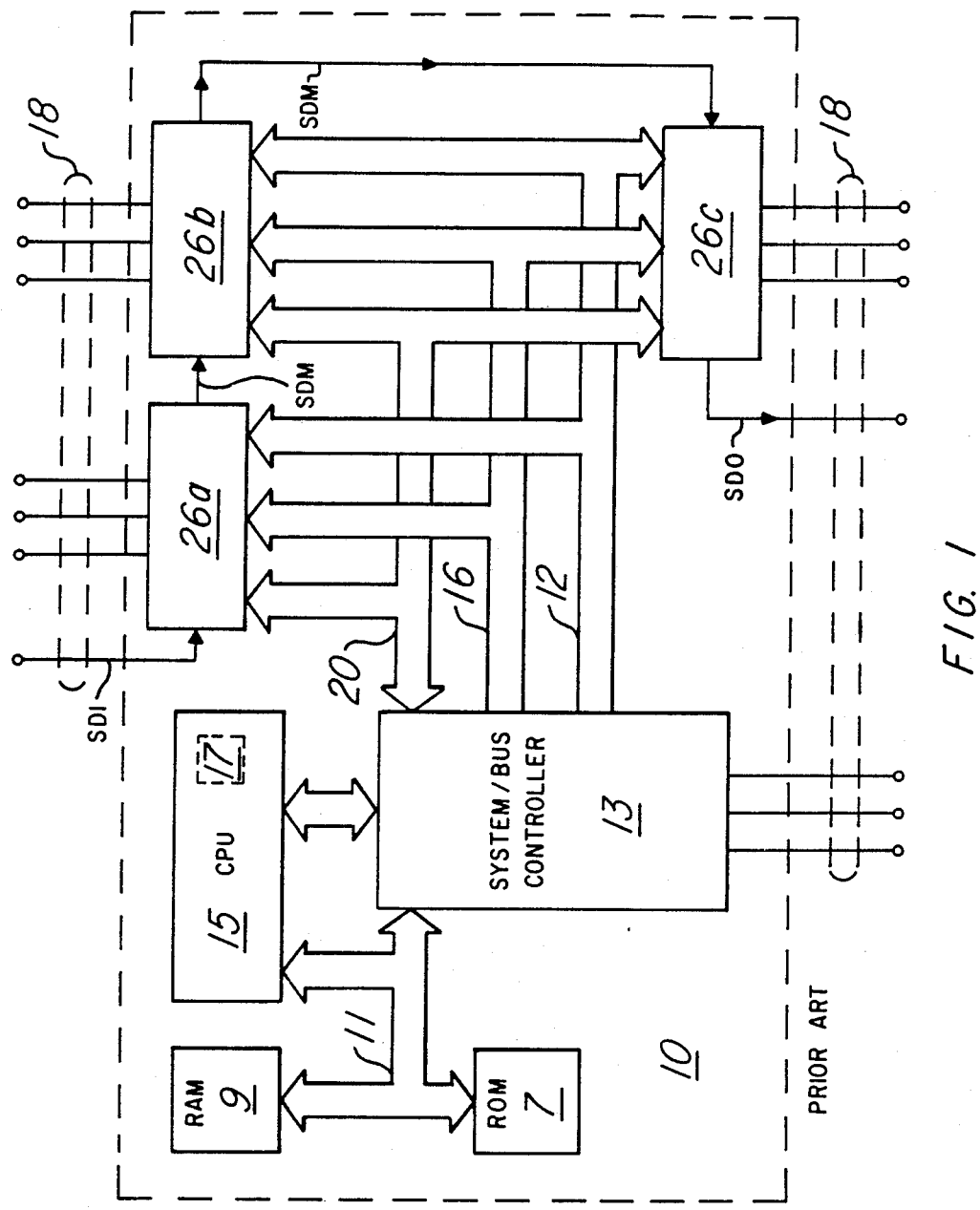
FIG. 1 is a block diagram of a modular logic circuit according to the prior art.

Referring to FIG. 1, logic circuit 10 is shown according to the prior art. Logic circuit 10 of FIG. 1 is a microcomputer, having on-board memory consisting of read-only memory (ROM) 7 and random access memory (RAM) 9. Certain logic functions, such as timing, peripheral and communication interfacing, and analog/digital conversion, is performed by logic modules 26a through 26c, each of which are connected to control bus 12, address bus 16, and data input/output bus 20. Of course, any number of logic modules 26 may be included in logic circuit 10 and connected to buses 12, 16 and 20; three such modules 26 are illustrated in FIG. 1 by way of example. Access to buses 12, 16 and 20 is controlled by bus/system controller 13, which itself is under the control of central processing unit (CPU) 15. CPU 15 is a central processing unit for the execution of programming instructions, as is well known in the art. CPU 15 is controlled by control ROM 17, which is used to decode instructions received from ROM 7 or RAM 9 via memory bus 11. CPU 15 is responsive to the output of control ROM 17 to perform the desired operations according to the decoded program instruction, including control of system/bus controller 13 so that the necessary access to address bus 16 and data input/output bus 20 by modules 26 occurs, via the appropriate signals on control bus 12. External interface to logic circuit 10 is done by way of terminals 18 shown in FIG. 1 as connected to modules 26 and system/bus controller 13; external connection of course may also be made by way of terminals 18 connected to the other portions of logic circuit 10, depending upon the function to be carried out by logic circuit 10.

Logic circuit 10 of FIG. 1 has scan paths and associated circuitry incorporated into modules 26 for facilitation of electrical test. The data path into these scan paths is shown in FIG. 1 by the line SDI entering module 26a, lines SDM serially interconnecting modules 26a, 26b and 26c, and line SDO exiting module 26c. As disclosed in said patent numbers 4,710,933, 4,710,931, 4,701,921 and 4,698,588, lines SDI and SDO may instead by configured as buses, by interconnection to each of modules 26 in logic circuit 10; the arrangement shown in FIG. 1 is by way of example only.

Figure 2:
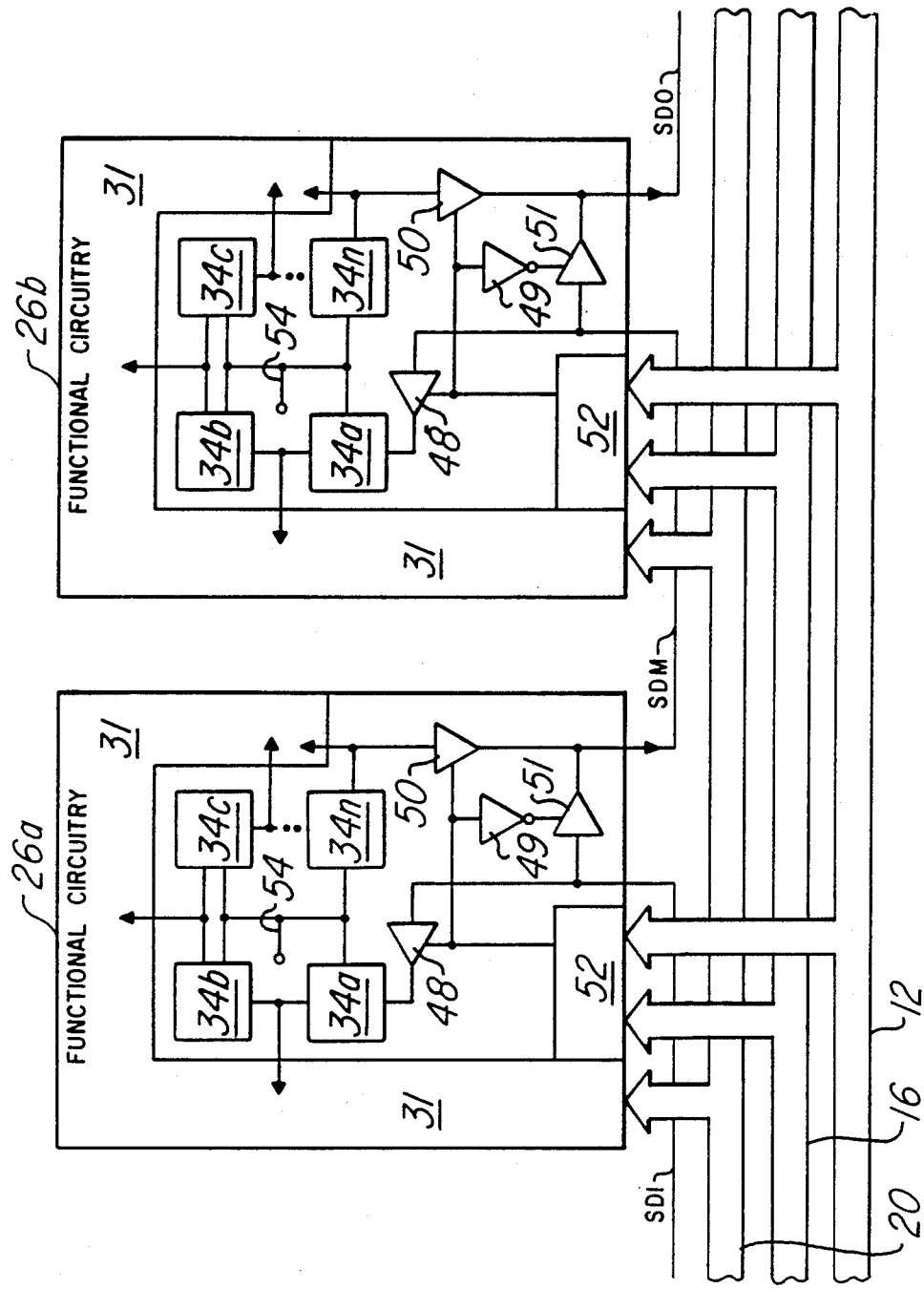
FIG. 2 is a block diagram of two of the modules in the logic circuit of FIG. 1.

A schematic diagram of an example of a scan path and associated circuitry is shown in FIG. 2, in the context of two modules, 26a and 26b. As disclosed in said patent numbers 4,710,933, 4,710,931, 4,701,921 and 4,698,588, each of the modules 26 are addressable for test purposes via address bus 16, by way of address decoder/selector 52. Each of the modules further include scan register latches (SRLs) 34a through 34n, the output of each being connected to predetermined nodes in functional circuitry 31 of each of the modules 26. In module 26a, the input of SRL 34a is connected to scan data in line SDI via buffer 48, and the output of SRL 34n is connected to scan data line SDM via buffer 50; similarly, in module 26b the input of SRL 34a is connected to scan data line SDM via its buffer 48, while the output of SLR 34n is connected to scan data out line SDO via its buffer 50. In each module 26, buffers 48 and 50 are controlled by address decoder/selector 52, which receives signals on address bus 16 and control bus 12. Buffer 51 in module 26a is connected between line SDI and line SDM, and is controlled by address decoder/selector with the same signal as which controls buffers 48 and 50, after inversion by inverter 49. Similarly, buffer 51 in module 26b is connected between line SDM and line SDO and is controlled by the inverter signal controlling buffers 48 and 50. It should be noted that functional circuitry 31 is also connected to address bus 16 and control bus 12 for use in the normal operating mode of module 26, although such connection is not shown in FIG. 2 for the sake of clarity. Functional circuitry 31 is of course connected to data input/output bus 20.

Within each module 26, SRLs 34 are serially interconnected so that data can be shifted from buffer 48 through SRLs 34 to buffer 50, responsive to shift clock signals appearing on line 54 shown in FIG. 2. Line 54 carries one or more clock signals required for the serial communication of data among SRLs 34, said clock signals generated from the system clock of logic circuit 10. While a single line 54 is shown in FIG. 2 for the sake of clarity, more than one line may bring in said clock signals, depending upon the number of stages in each of SRLs 34. For example, if each of SRLs 34 are master/slave latches, two clock signals carried on two lines are necessary. Line 54 may be one of the lines in control bus 12, or may be otherwise brought in to modules 26.

In operation of the test sequence, control signals on control bus 12 will be generated by system/bus controller 13, for receipt by address decoder/selector 52 to indicate that logic circuit 10 is to be placed in test mode. Address decoder/selector 52 in each module 26 will then decode the the logic state of the lines of address bus 16 to determine if its module 26 is being addressed. If its module 26 is being addressed, address decoder/selector 52 will enable buffers 48 and 50 and, because of inverter 49, disable buffer 51. As an example, if module 26a were addressed with module 26b not addressed in test mode, buffers 48 and 50 in module 26a would be enabled (and buffer 51 in module 26a disabled) so that SRLs 34a through 34n would be connected between lines SDI and line SDM. Buffers 48 and 50 in module 26b would be disabled and buffer 51 enabled therein, module 26b not being addressed, so that SRLs 34a through 34n in modules 26b are effectively removed from the scan chain. The data on line SDM from SRL 34n in module 26a would then appear on line SDO via buffer 51 of module 26b. In this example, as described in said copending applications S.N. 790,569, S.N. 790,543, S.N. 790,541 and S.N. 790,598, module 26a can be tested by the scan chain of SRLs 34 therein, without requiring the scanning of data through SRLs 34 in module 26b.

Each of SRLs 34 can be constructed in any of a number of well-known forms for latches. It is preferable, however, to use two-stage latches for SLRs 34 for purposes of data integrity. Examples of latches useful as SRLs 34 are described in U.S. Patent No. 4,667,339, issued on May 19, 1987 and assigned to Texas Instruments Incorporated, and also in said patent numbers 4,710,933, 4,710,931, 4,701,921 and 4,698,588.

Figure 3:
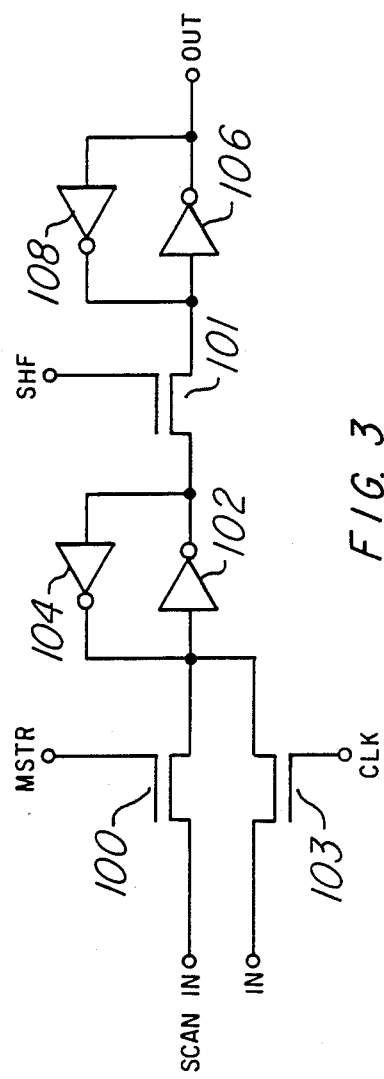
FIG. 3 is a schematic diagram of a serial register latch.

By way of example, one preferred construction of an SRL 34 is schematically shown in FIG. 3. SRL 34 shown in FIG. 3 is a static master/slave latch, having two inputs SCANIN and IN, connected via pass gates 100 and 103 to a master stage of SRL 34. Pass gate 100 is controlled by a clock signal MSTR, while pass gate 103 is controlled by a clock signal CLK. Clock signal MSTR is generated during the scan operation, and clock signal CLK is generated during the functional operation of the logic circuit. The master stage of SRL 34 consists of inverters 102 and 104, with the output of inverter 104 connected to the input of inverter 102 and with the input of inverter 104 connected to the output of inverter 102. A pass gate 101 connects the output of inverter 102 to the slave stage of SRL 34; pass gate 101 is controlled by clock signal SHF which, as discussed above, is the data shift signal utilized in modules 26 of the logic circuit. The slave stage is similarly constructed by way of inverters 106 and 108, with the output of one connected to the input of the other. Any of a number of well known configurations of logic inverters may be used for inverters 102, 104, 106, and 108; the actual construction is likely to depend upon the technology used in the construction of the functional circuitry 31 in the logic circuit. It is useful, however, for the transistors comprising inverters 104 and 108 to have less drive capability than the transistors comprising inverters 102 and 106, so that if a logic state is driven at the input of inverters 102 and 106 which is opposite that of the state stored by the stages of SRL 34, inverters 102 and 106 will change state responsive to the input (rather than having inverters 104 and 108 control the state of the latch stage regardless of the input). Such design considerations can easily be incorporated by one of ordinary skill in the art.

Figure 3A:
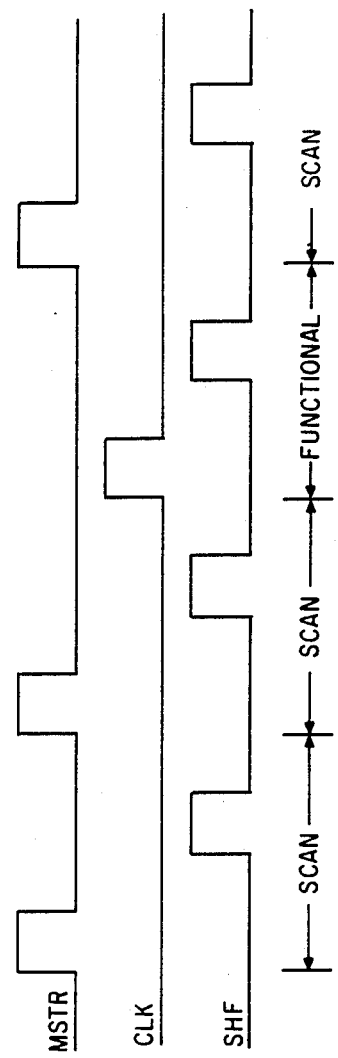
FIG. 3a is a timing diagram for clock signals used in operation of the serial register latch of FIG. 3.

In operation, clock signals MSTR, CLK and SHF are derived from a system clock which is externally presented to the logic circuit, or may be generated by the logic circuit itself having reference to a crystal oscillator connected externally thereto. Clock signals MSTR and CLK are signals substantially in phase with one another, except that clock signal MSTR is generated only during scan operations and that clock signal CLK is generated only during functional operations. Clock signal SHF is generated during each system clock cycle in such a manner that it does not overlap clock signals MSTR or CLK. FIG. 3a illustrates the timing relationship among clock signals MSTR, CLK and SHF in both scan and functional cycles. The two-phase non-overlapping clocks controlling SRL 34 prevents both pass gates 100 (or 103) and 101 from being conductive at the same time. Clock signals MSTR, CLK and SHF can generated from a system clock signal in a manner well known in the art; as will be described below, the generation of clock signal MSTR can be gated by an external signal for enabling the scanning in and out of data through the scan chain. SRL 34 of FIG. 3 therefore operates in such a fashion that the master stage of inverters 102 and 104 is loaded responsive to either line MSTR or line CLK going to a "1" logic state, and so that the slave stage of inverters 104 and 106 are loaded responsive to line SHF going to a "1" logic state.

Since clock signal MSTR is operative during scan operations, the connection of a series of SLRs 34 with line OUT connected to line SCANIN of the next succeeding SRL 34 allows the shifting of data through the series of SLRs 34 as the scan chain. During functional operation, however, clock signal MSTR is held to a low, inactive, logic level which effectively disables the scan chain. With the activation of clock signal CLK during functional cycles (pass gate 100 non-conductive), the logic state on line IN will be loaded into the master stage of SRL 34, and with the next pulse of clock signal SHF loaded into the slave stage of SRL 34. Line IN of SRL 34 is connected to a node in the functional circuitry so that the logic state of the node is effected by SRL 34 upon pass gate 103 connecting the node to the input of inverter 102 during functional operation. It should also be noted that line OUT of SRL 34 may also be connected to a node of the functional circuitry so that the state of the node may be set by inverter 106. The node to which line OUT is connected may be the same node as that connected to line IN, for control and observation of the same point in the functional circuitry with a single SRL 34.

In the operation of logic circuit 10 of FIGS. 1 and 2 in its test mode, a module 26 is addressed by way of an address signal presented on address bus 16 by bus/system controller 13, in conjunction with control signals on control bus 12 which tells each of the modules that the signals on address bus 16 is a module address for test purposes. The modules 26 are assigned a unique module address. Address decoder/selector 52 in the module 26 corresponding to the module address signal on address bus 16 will enable buffers 48 and 50, so that a serial path exists from line SDI to line SDO, through SRLs 34a through 34n in the selected module. Address decoder/selector 52 in the unselected ones of modules 26 will not have their buffers 48 and 50 enabled, and accordingly the signals appearing on line SDI will be of no effect to the SRLs 34 in the unselected modules, and also line SDO will be unaffected by the contents of SRL 34n in the unselected modules. A test data pattern is then serially scanned into SRLs 34 of the selected module by the application of digital data to line SDI and generation of the clock signals on lines MSTR and SHF. The test data pattern is the series of digital data stored in the SRLs 34 at the end of the scan operation, and which will be applied to the nodes of the functional circuitry of the module connected to line OUT of each of the SRLs 34. After the desired test data pattern is loaded into the SRLs 34, the functional circuitry of the selected one of modules 26 is exercised by CPU 15 via control bus 12 in a predetermined manner corresponding to the desired test of the module with the scanned test pattern, during which a high level of clock signal CLK occurs. As discussed above relative to FIG. 3, the pulse of clock signal CLK will load the master stage of SRLs 34 with the logic state of line IN, corresponding to the logic state of the functional circuitry node. The contents of SRLs 34 in the selected module are then scanned out onto line SDO by way of a series of clock signals on lines MSTR and SHF. By sensing the serial data on line SDO and comparing it to the expected serial data for a perfect module presented with that particular test data pattern and exercise, the user (via automatic test equipment) can determine whether or not the selected module 26 has a defect and, in many cases, the location of the defect in the functional circuitry. A number of different test data patterns may be utilized for the same one of modules 26 for a thorough test sequence.

The addressability of the individual modules 26 provides the advantage that the scan data for a given module need not be scanned through intervening modules. Accordingly, the overall test time for logic circuit 10 is merely the sum of the test times for each individual module, since the scanning in and out of data need not be done through all intervening modules. However, it is apparent from FIG. 1 that a user may test modules 26 only by so instructing CPU 15, which in turn directs the operation of system/bus controller 13. Accordingly, CPU 15 and system/bus controller 13 must also be operable for the test of modules 26 to be valid.

FIGS. 1 and 2 illustrate that data input/output bus 20 is connected to functional circuitry 31 in each of the modules 26, for access to and from registers therein. Some of these registers may be parallel register latches (PRLs) as disclosed in said patent numbers 4,710,933, 4,710,931, 4,701,921 and 4,698,588, which can further improve the testability of the modules in such a configuration. However, the use of data input/output bus 20 for the loading and unloading of test data also presents certain problems, if done without control of the interface to data input/output bus 20 being coupled to the selection of the module as described with respect to the preferred embodiments of the invention hereinbelow. For example, the unselected ones of modules 26 must not present data on data input/output bus 20 which conflicts with the loading and unloading of data into the selected one of modules 26. Conversely, the loading and unloading of data into selected ones of modules 26 via data input/output bus 20 may also disturb the contents of registers in the unselected ones of modules 26. Such problems reduce the ability to use a previously generated module test algorithm in a new logic circuit.

In addition, it is also desired to use the benefits of modular scan paths in testing CPU 15 and system/bus controller 13. However, the implementation of the modular scan paths in these modules of the microcomputer necessarily requires the bus arrangement for addressing the modules and for scanning data which is different from that for modules 26. Such special test interface circuitry will similarly reduce the portability of a module test algorithm from one logic circuit realization to another realization using the same module.

Figure 4:
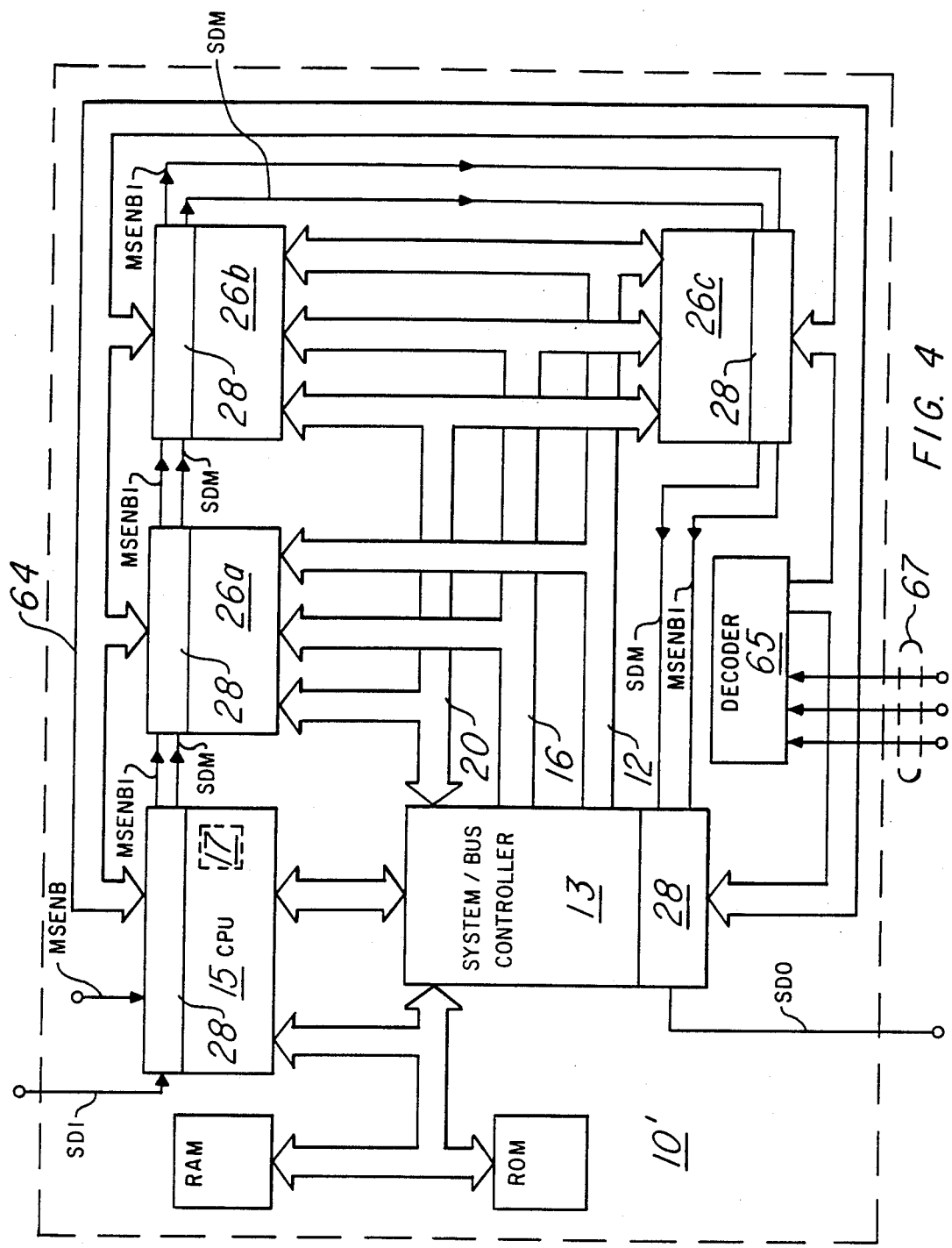
FIG. 4 is a block diagram of a modular logic circuit constructed according to the invention.

Referring now to FIG. 4, logic circuit 10' is shown which incorporates the present invention. Each of the blocks in logic circuit 10' correspond to similar blocks in logic circuit 10 of FIG. 1, with the addition of test port 28 in each of CPU 15, system/bus controller 13 and modules 26a through 26c. Test bus 64 interconnects each of the test ports 28 among the modules, and is controlled by decoder 65 which interprets signals from external terminals 67. The other external terminals 18 of logic circuit 10 are omitted from FIG. 4 for the sake of clarity. As will be explained in greater detail below, test bus 64 provides control signals to test ports 28 to enable, and to operate, the test mode of the logic circuit. Decoder 65 provides simple combinational logic for interpretation of the inputs at the external terminals; of course, if the user wished to directly control test ports 28 from external to logic circuit 10′, decoder 65 would not be required.

External terminals are shown connected to lines SDI and SDO, as in FIG. 1. In addition, line MSENB is connected to test port 28 of CPU 15 of logic circuit 10′, and may be connected to an external terminal or internally generated. Lines MSENBI serially interconnect test port 28 of CPU 15 to the other of test ports 28. Lines MSENB and MSENBI are used in the selection of one (or more) of modules 26 (or CPU 15 or system/bus controller 13) for test mode; this selection, as will be discussed below, is done by the scanning in of a module select pattern in a fashion similar to that of the data scan path. The ability to scan in the module enable information via lines MSENB and MSENBI removes the necessity in each of the modules 26 for a decoder connected to address bus 16, and also allows the inclusion of CPU 15 and system/bus controller 13 into the same scan path system despite the dissimilar functional bus interconnections of these functions. As is evident from FIG. 4, the use of test bus 64 is not dependent upon the architecture of the logic circuit relative to its functional buses. As will be further described hereinbelow, this provides for easy portability of the test pattern for a module from a first logic circuit realization to another, with minimum customization required because of the functional system bus architecture.

It should be noted that, while FIG. 4 illustrates that logic circuit 10′ has a microcomputer architecture, the utilization of the subject invention is independent of the function and architecture of logic circuit 10′. As is well known in the art, the use of scan paths for test of a logic circuit is not dependent upon, and does not require consideration of, the functional application of the logic circuit under test. Accordingly, the instant invention is applicable to any type of logic circuit which can be divided into modules for test purposes. In addition, while FIG. 4 shows functional blocks of circuitry as the testable modules, the test boundaries need not correspond to the functional boundaries of the various modules; for example, CPU 28 may have a plurality of selectable test modules therein. Of course, the full benefit of the instant invention in allowing portability of the test patterns can be achieved only when the ported functional modules contain complete test modules.

Figure 5:
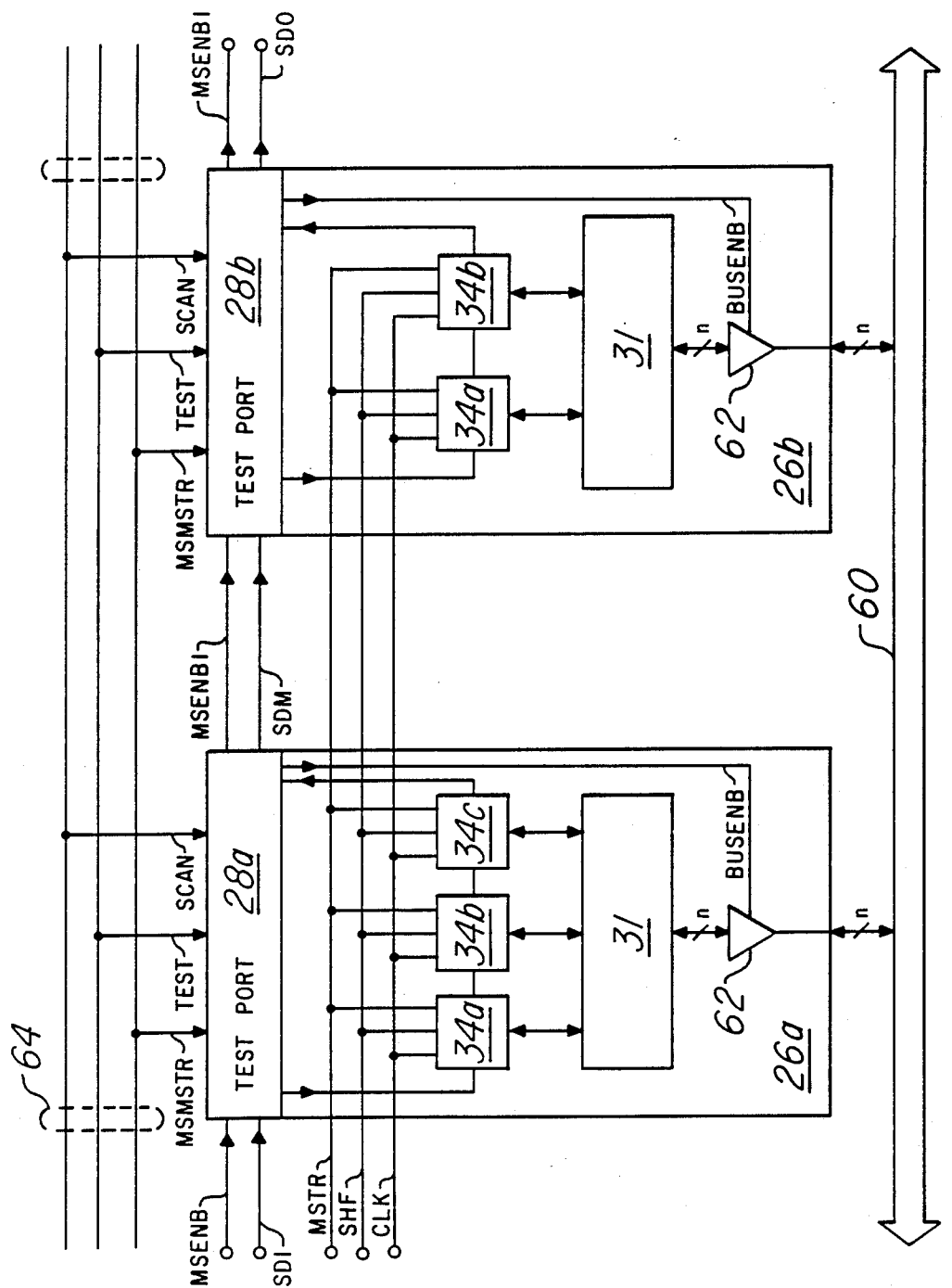
FIG. 5 is a block diagram of two of the logic modules of FIG. 4 constructed according to a first embodiment of the invention.

Referring now to FIG. 5, two modules 26a and 26b of the logic circuit of FIG. 4, constructed according to a first embodiment of the invention, are shown in block diagram form. It is of course understood that any number of modules may be used in the practice of the subject invention, as illustrated in FIG. 4, with the further interconnection among said modules done similarly to the interconnection shown in FIG. 5. FIG. 5 is limited to illustrating two modules for the sake of clarity. System bus 60 is shown as connecting to each of modules 26a and 26b. System bus 60 represents any or all of the buses of FIG. 4, i.e., address bus 16, data input/output bus 20 and control bus 12. As will become apparent from the description hereinbelow, the functions of address bus 16, data input/output bus 20 and control bus 12 are independent from the test functions; accordingly, it is accurate from a descriptive standpoint to consider system bus 60 as performing any or all of said functions. System bus 60 is bidirectionally connected to functional circuitry 31 of modules 26a and 26b via buffer 62. As discussed above, functional circuitry 31 may contain PRLs to further assist the test operation of the module; any such PRLs may be loaded and unloaded to and from system bus 60 via buffer 62. Buffer 62 is under the control of signal BUSENB, coming from test ports 28a and 28b as will be explained below.

Besides functional circuitry 31, modules 26a and 26b each contain SRLs 34. The number of SRLs 34 contained in each of modules 26a and 26b are not dependent upon the construction of neighboring modules, but depend upon the number of points in functional circuitry 31 of each module which the designer wishes to observe and/or control in test mode. By way of example, module 26a contains three SRLs 34a through 34c, while module 26b contains two SRLs 34a and 34b. Each of said SRLs are connected to a predetermined point in functional circuitry 31 of the respective module 26a and 26b.

Test ports 28a and 28b comprise the interface between each of the modules for purposes of loading and unloading the scan data. The input to first SRL 34a in each of modules 26a and 26b comes from test port 28a and 28b, respectively; the output of the last SRL (34c in module 26a and 34b in module 26b) is connected to test port 28 of the respective module 26a and 26b. As will be discussed in greater detail below, SRLs 34 will, when their respective module 26a or 26b is enabled, comprise a scan path from line SDI to line SDO, with data shifting therethrough responsive to the clock signals on line MSTR. Of course, as described above, line SHF is also necessary for the shifting of data through SRLs 34, but is not shown in FIG. 5 for purposes of clarity. As discussed above, clock signal CLK controls the loading of SRLs 34 from functional circuitry 31; clock signal CLK may also be utilized for other clock functions within functional circuitry 31. As discussed above, the signals on lines MSTR (and CLK, as the case may be) do not overlap with the clock signals on line SHF. Test ports 28a and 28b are serially interconnected via line SDM, so that the scan data can come from a single source and proceed to a single output. As shown in FIG. 4, lines SDI and SDO may connect to external terminals of the logic device, for direct access by the user and by automatic test equipment.

Test bus 64 presents a select shift signal on line MSMSTR, a test enable signal on lines TEST and a scan enable signal on lines SCAN. The test enable signal on line TEST enables control of signal BUSENB during test mode only; during normal functional operation of the logic circuit containing modules 26a and 26b, the test enable signal on line TEST unconditionally enables buffer 62 in each of the modules so that communication via system bus 60 is controlled as per normal operation. The scan enable signal on line SCAN enables data to be scanned through the SRLs 34 of the enabled module 26a or 26b without interference by or to system bus 60.

Test ports 28a and 28b further serve the purpose of enabling the desired module 26a or 26b (and as will be discussed later, possibly both modules 26a and 26b). A module enable signal is received on line MSENB by test port 28a of module 26a, and is shifted to module 26b via line MSENBI. As will be described below, a latch is contained in each of test ports 28a and 28b which is loaded with the state of line MSENB responsive to a select shift signal on line MSMSTR. Thus, a serial data stream on line MSENB will configure the scan paths in the series of modules 26 so that one or more of said scan paths are enabled. For example, a "1" logic state stored by test port 28a will enable the scan path in module 26a while a "0" logic state stored in test port 28a will cause the scan path in module 26a to not be enabled. Line MSENB therefore allows the addressing and selection of an individual module in logic circuit 10' without using system bus 60. Accordingly, as shown in FIG. 4, the test function may be invoked, and data scanned into SRLs 34, of modules 26 without the intervention of CPU 15 and system/bus controller 13; in addition, CPU 15 and system/bus controller 13 may themselves by tested using the modular scan path technique, even if not connected to system bus 60. It will be apparent that pulses on line MSMSTR should occur only during such time as the configuration data is being loaded into test ports 28.

Line SCAN may also be used to gate the generation of the clock signal on line MSTR, so that a clock pulse on line MSTR occurs only when line SCAN is at a high logic level. By disabling the shifting of data through the scan chain of SRLs 34 during a functional cycle, the scan chain will be transparent to the functional circuitry when in the functional mode.

Figure 6:
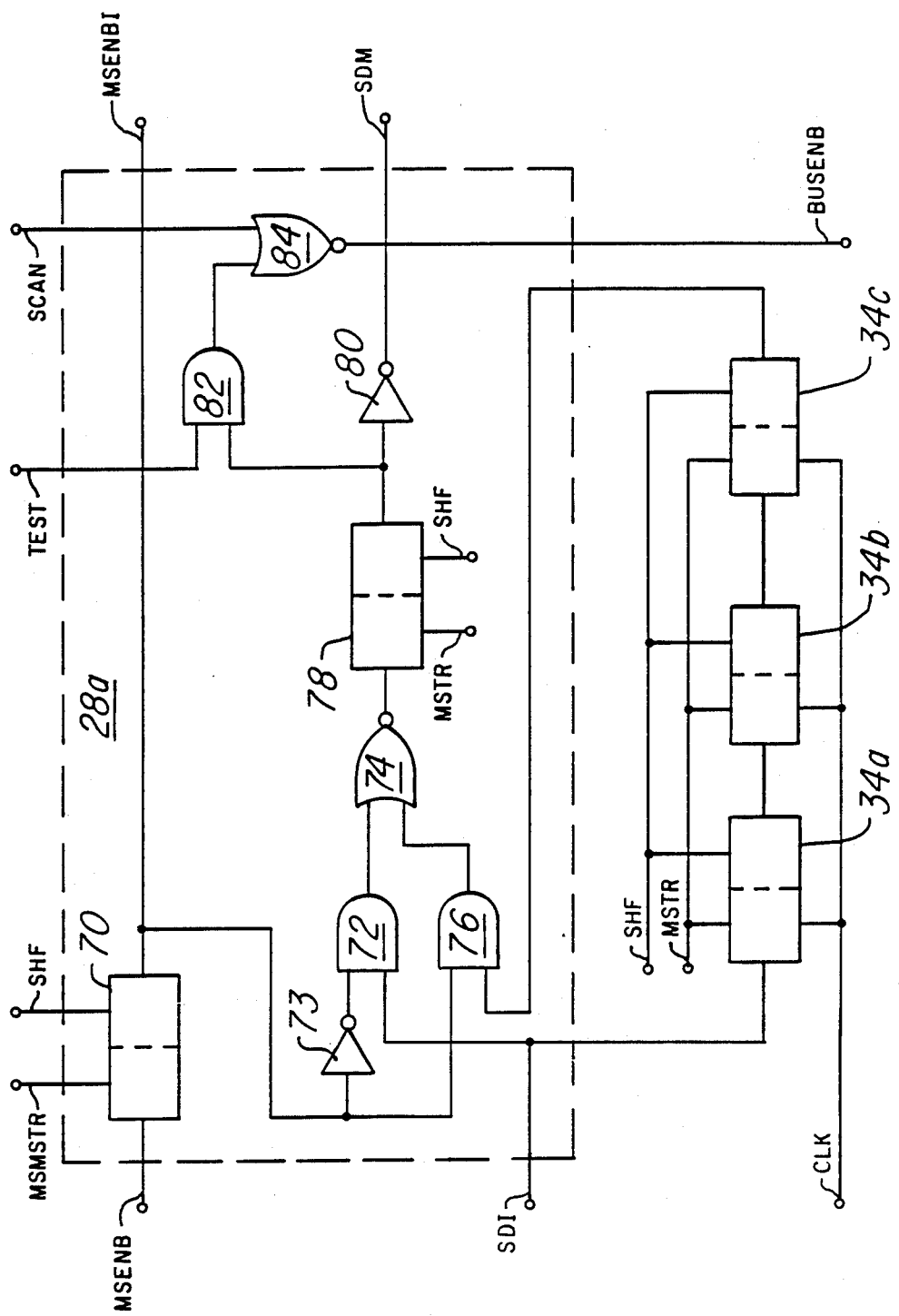
FIG. 6 is an electrical diagram, in schematic form, of one of the modules shown in FIG. 5.

Referring now to FIG. 6, the construction of test port 28a and its connection to SRLs 34a through 34c is illustrated. Line MSENB is connected to latch 70, as is line MSMSTR from test bus 64. Latch 70 is a two-stage latch such as SRLs 34 illustrated in FIG. 3, but may be constructed according to any one of a number of well known latch designs. Similarly as in SRLs 34, clock signal SHF loads the slave stage of latch 70 with the output of the master stage thereof. However, a high logic state on line MSMSTR will load latch 70 with the data state of line MSENB. The clock signal on line MSMSTR is also generated from a system clock to occur substantially simultaneously with the clock signal on line MSTR (as shown in FIG. 3a), and not overlapping clock signal SHF. The contents of the slave stage of latch 70 is, after being loaded responsive to the clock signal on line SHF, output onto line MSENBI for input into the master stage of the counterpart of latch 70 in module 26b.

Line SDI is connected to the input of SRL 34a, and also is connected to one input of AND gate 72. Connected to the other input of AND gate 72 is the output of latch 70, after inversion by inverter 73. The output of AND gate 72 is connected to one input of NOR gate 74. The output of latch 70 is also connected (not inverted) to one input of AND gate 76, which has its other input connected to the output of SRL 34c. The output of AND gate 76 is connected to the other input of NOR gate 74. The output of NOR gate 74 is connected to the input of latch 78, which also is constructed according to FIG. 3. The output of NOR gate 74 is stored into the master stage of latch 78 by clock signal MSTR, and into the slave stage of latch 78 by a positive-going edge presented on SHF. The output of latch 78 is inverted by inverter 80, and appears on line SDM for input into test port 28b.

It is apparent from FIG. 6 that the logic comprised of AND gates 72 and 76, inverter 73 and NOR gate 74 serves to control the flow of data from line SDI through test port 28a. If the contents of latch 70 are at a "0" logic state, the output of AND gate 76 is necessarily also a "0". However, the output of AND gate 72 is controlled by the logic state of line SDI. Accordingly, the output of NOR gate 74 is the inverted logic state of line SDI whenever the output of latch 70 is at a "0" logic state. This causes a "0" logic state stored by latch 70 to correspond to module 26a not being selected for the test function, since the output of SRL 34c is disconnected from line SDM. Instead, when module 26a is not selected, the logic state on line SDI appears on line SDM, after storage by latch 78 (and inverted twice by NOR gate 74 and inverter 80). Therefore, when a module 26 is not selected, data is shifted directly from the scan data input to the scan data output of its test port 28 (in the case of test port 28a, the scan data input is line SDI, while the scan data output is line SDM). The SRLs 34 associated with the unselected modules are removed from the scan chain by decoupling the output of the last SRL 34 (in the case of test port 28a, SRL 34c) from the scan data output of the test port 28. It should be noted that, in the configuration of FIG. 6, scan data presented on line SDI will shift into the slave stages of SRLs 34, but such data is of no effect since the output of the last SRL 34 (SRL 34c in test port 28a) is disconnected from the rest of the circuit.

Figure 6A:
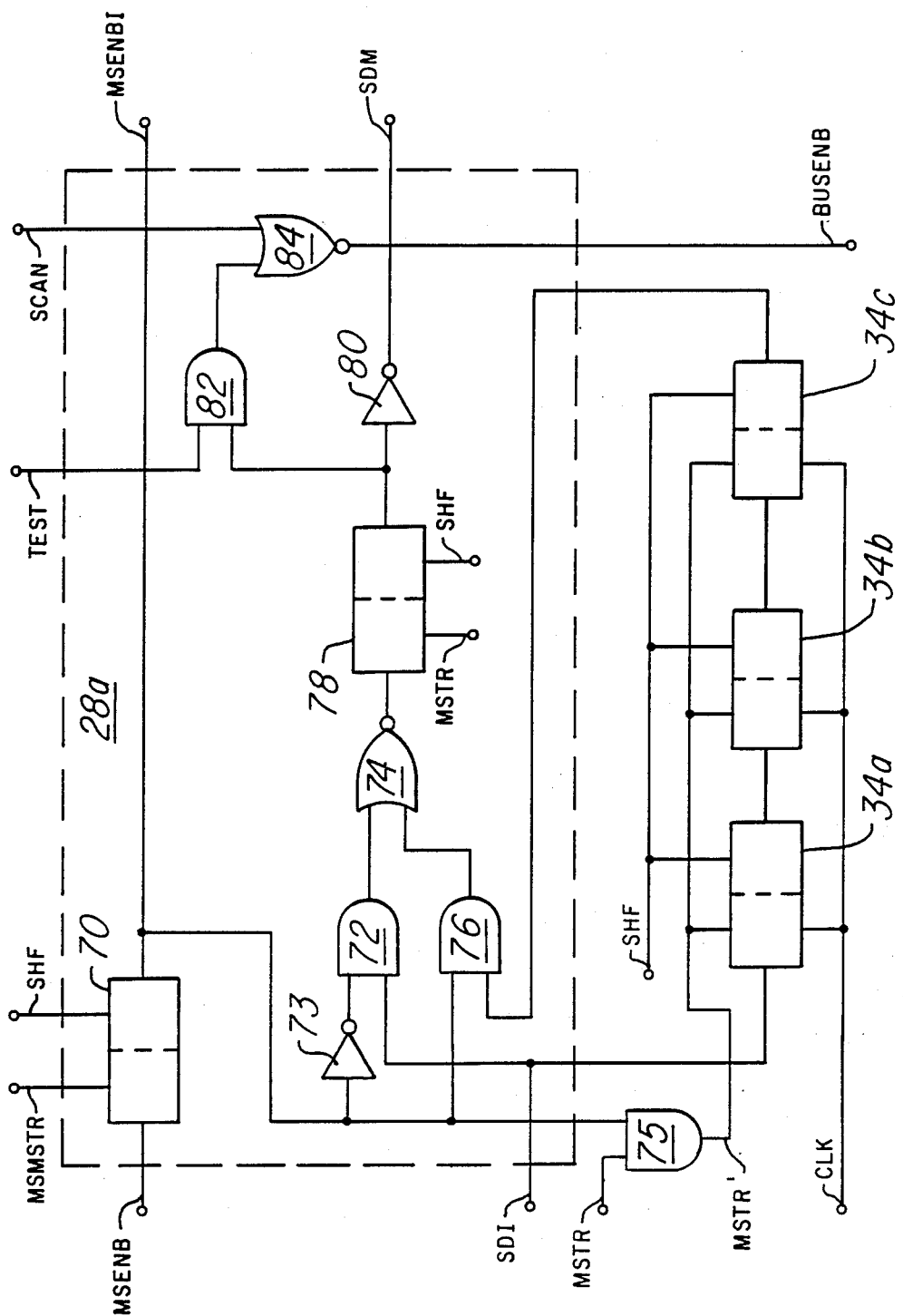
FIG. 6a is an electrical diagram, in schematic form, of another embodiment of the module of FIG. 6.

It should be noted that certain uses of the scan path of SRLs 34 require that the data therein not be corrupted during a scan into another module. For example, it may be useful to have no-selected modules functionally operating both before and after data is scanned into or out of a selected module, with the pre-scan data state of the non-selected modules being retained for post-scan use. If data were necessarily shifted into SRLs 34 of unselected modules, the user would be required to unload such SRLs 34, read the data, and represent the prior data thereto during the scan. It is therefore preferable, in many applications, to gate the clock signal on line MSTR to each SRL 34 with the contents of latch 70 in such a manner that shifting within the SRLs 34 is disabled when the module 26 associated therewith is not selected. FIG. 6a illustrates module 26a and test port 28a of FIG. 6, with AND gate 75 performing the gating of clock signal MSTR and the contents of latch 70. Line MSTR' from the output of AND gate 75 thus is held low, disabling the master stage of each SRL 34 and preventing the shifting of data through the scan chain, when latch 70 contains a "0" logic level, i.e., when the associated module 26 (in this case, module 26a) is not selected.

Referring back to FIG. 6, if the contents of latch 70 are a "1" data state, the output of SRL 34c appears on line SDM via latch 78 (and the two inversions by NOR gate 74 and inverter 80). Accordingly, when module 26a is selected, the data path from line SDI to line SDM goes through SRLs 34a through 34c. Therefore, the occurrence of four pairs of pulses on lines MSTR and SHF after the contents of latch 70 are set to a "1" logic state will load SRLs 34a with a test data pattern, and set latch 78 to its desired state. The additional positive-going pulse of the clock signal on line SHF is necessary, as will be described below, to set latch 78 to the necessary state for control of the signal on line BUSENB.

The contents of latch 78 are used to generate the signal on line BUSENB, which controls buffer 62 as shown in FIG. 5. In this embodiment of the invention, the control of buffer 62 is controlled by the contents of latch 78 both in selected and unselected modules. As is evident from FIG. 6, and as will be further explained below, latch 78 of each module is in the overall scan path of logic circuit 10' regardless of whether or not the associated SRLs 34 are included in the scan path. Of course, combinational logic for controlling of line BUSENB responsive to additional signals on test bus 64 or otherwise may be used within the spirit of this invention; however, the scanning of bus control data into latch 78 is both selected and unselected modules requires minimal external interconnection. Accordingly, the output of latch 78 is connected to one input of AND gate 82. Line TEST from test bus 64 is connected to the other input of AND gate 82. The output of AND gate 82 is connected to one input of NOR gate 84; line SCAN from test bus 64 is connected to the other input of NOR gate 84. The output of NOR gate 84 is line BUSENB.

In operation, the scan signal on line SCAN is at a "1" logic state during such time that the test data pattern is being scanned into SRLs 34 of the selected modules, and into the latches 78 of all modules for control of buffer 62. The "1" logic state of line SCAN will unconditionally disable buffer 62 by placing a "0" logic state on line BUSENB. This allows data to be scanned along the scan path without interference between the scan path and system bus 60. Such interference can occur because the state of SRLs 34 during the scanning of data may cause functional circuitry 31 to attempt to drive conflicting data signals on system bus 60. If functional circuitry 31 uses CMOS static drivers to drive system bus 60, a bus conflict can create a DC path from a power supply to ground through two "on" transistors which can damage the logic circuit. Unconditionally disabling buffer 62 during scanning of data prevents the intermediate states of SRLs 34 and latches 78 from creating the conflict on system bus 60.

The test signal on line TEST is at a "1" logic state during such time that the logic circuit is placed into its test mode. The "0" logic state on line TEST, corresponding to normal operation of the logic circuit and functional circuitry 31 of module 26a, will necessarily present a "0" logic state on the output of AND gate 84. Therefore, test port 28 is transparent to functional circuitry 31 (i.e., buffer 62 is enabled) if both line TEST and line SCAN are in their "0" logic state, corresponding to the logic state neither being in its test mode nor scanning data into SRLs 34 (or latch 78 in any of the modules. When line TEST is in its "1" logic state, corresponding to the logic circuit being in its test mode (and assuming that data is not being scanned in, i.e., line SCAN is at a "0" logic state), line BUSENB and control of buffer 62 depends upon the contents of latch 78. In this way, access to system bus 60 may be selectively enabled or disabled for each module, whether or not the module is the selected module for scan path purposes. For example, if functional circuitry 31 of module 26a contained PRLs which were to be loaded to and from system bus 60 during test, latch 78 would be loaded with a "0" logic state (corresponding to a "1" logic state scanned in from line SDI to take NOR gate 74 into account) so that line BUSENB is at a "1" logic state to enable buffer 62. Conversely, to ensure that buffer 62 is disabled during test, latch 78 would be loaded with a "1" state.

Figure 7:
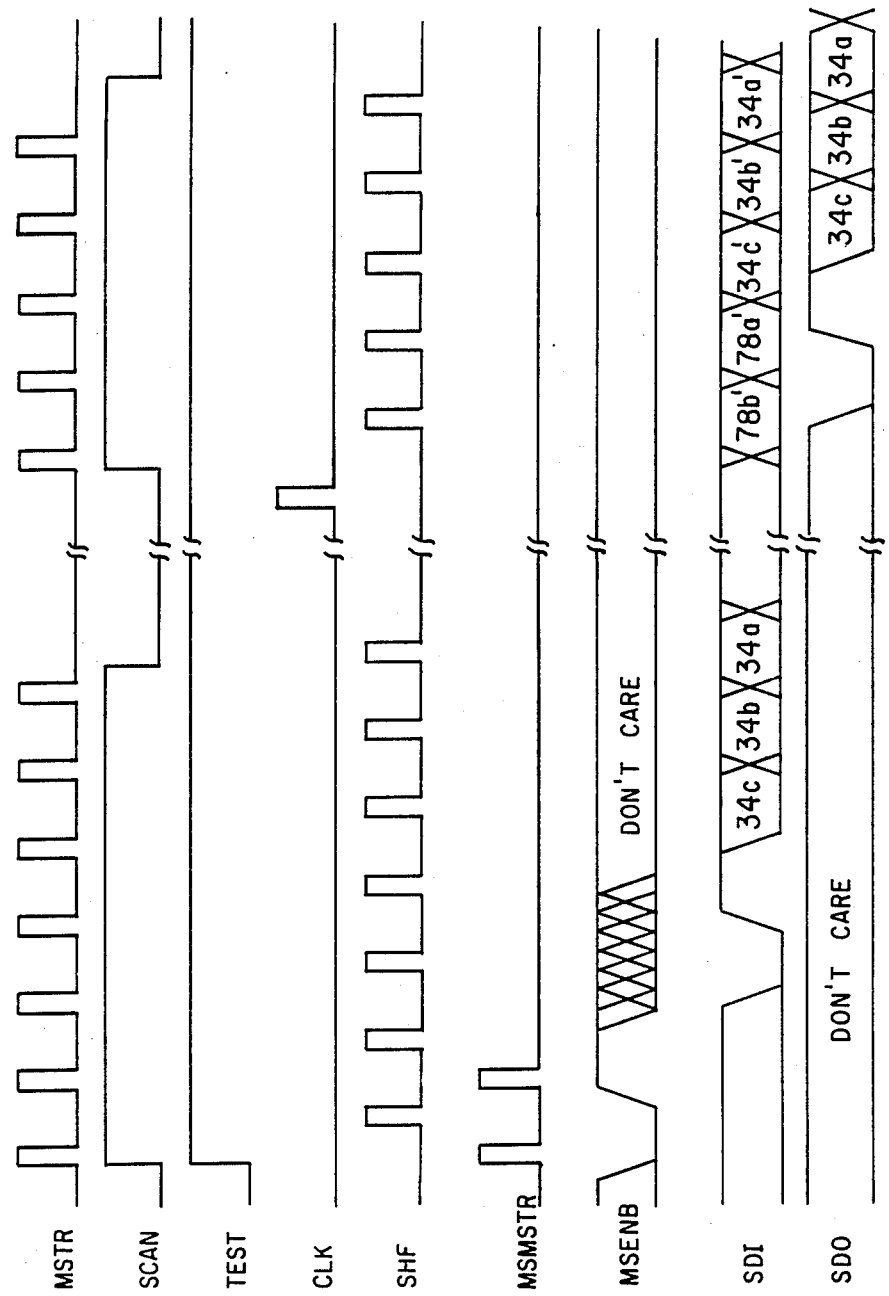
FIG. 7 is a timing diagram illustrating the operation of the test function of the first embodiment of the invention.

Referring now to FIG. 7, the operation of a test sequence for a logic circuit having modules 26a and 26b as shown in FIG. 5, with test ports 28 as illustrated in FIG. 6, will be explained. The signal on line SCAN is first set to its "1" logic state to unconditionally cause buffer 62 in all modules to disconnect system bus 60 from functional circuitry 31; the test mode signal on line TEST can also go to its "1" logic state at this time. In order to enable one of the modules 26a or 26b to have its SRLs 34 in a scan path, a serial data stream must be scanned in from line MSENB. As discussed above, the master stage of latch 70 is loaded on positive-going edges of the data shift signal on line MSMSTR, and the slave stage is loaded with positive edges of the clock signal on line SHF. The example where module 26a is selected and module 26b is unselected is illustrated in FIG. 7, by the serial data stream consisting of a "0" (for storage in latch 70 of test port 28b) followed by a "1" data state (for storage in latch 70 of test port 28a), synchronous with two pulses of the signals on line MSMSTR (followed by a pulse on line SHF).

Once module 26a is selected, the scan path will now consist of SRLs 34a through 34c in module 26a, plus latch 78 in test port 28a and latch 78 in test port 28b. The storage of a "0" logic state in latch 70 of test port 28a causes latch 78 of test port 28b to be loaded with the logic state of line SDM. In order to fill the latches in this scan path, five pulses of the clock signal on line MSTR are required. The serial data stream scanned in from line SDI will consist of a "0" logic state for storage (as a "1" logic state, due to NOR gate 74) in latch 78 of test port 28b, followed by a "1" logic state for storage (as a "0" logic state) in latch 78 of test port 28a (presuming that buffer 62 is desired to be enabled in this particular test mode). This is followed by the contents to be stored in SRLs 34c, 34b, and 34a, in that order. All data is of course presented on line SDI synchronously with the clock signals on line MSTR, followed of course by the slave clock signal on line SHF. Line SDO will at the same time present the contents of latches 78 from both modules followed by the contents of SLRs 34a through 34c of module 26a; these values are "don't care" for purposes of setting up the initial test. Once the latches 78 and SRLs 34 are loaded as desired, the scan signal on line SCAN of test bus 64 goes to a low state, enabling buffer 62 of module 26a (responsive to the "0" logic state stored in latch 78 of module 26a, which was the "1" logic state placed on line SDI inverted by NOR gate 74). The contents of SRLs 34a through 34c of module 26a set the logic state of their associated nodes in functional circuitry 31 of module 26a, as discussed above. The functional operation cycle may include the loading of PRLs in functional circuitry from system bus 60, which is enabled by the "0" logic state in latch 78 causing the signal on line BUSENB to go to a "1" logic state.

It should be noted that if access to system bus 60 is not required for a logic circuit or logic circuit module to be tested by way of the scan path, more than one module may be selected for test without conflict occurring by way of system bus 60. This is effected by storing a logic "1" level in latch 78 for more than one module within the logic circuits for the test sequence. For example, to select both modules 26a and 26b of FIG. 7 for test, a "1" logic state would be scanned into latch 70 of both test ports 28a and 28b. SRLs 34a and 34b of module 26b would then also be in the scan path, and the two modules 26a and 26b could be tested simultaneously.

The exercise of functional circuitry 31 in the enabled module 26a is done by clocking the system clock of the logic circuit, or by other means, during such time as the signal on line SCAN is low and the signal on line TEST is high. Functional circuitry 31 in module 26a is thus exercised according to a predetermined operation, and a pulse of the clock signal on line CLK is generated for loading the results of the functional cycle into SRLs 34 in the scan chain.

Once the exercise is complete, the scan signal on line SCAN returns to a "1" logic state to again unconditionally disconnect system bus 60 from functional circuitry 31 of module 26a. Five pulses of the clock signal on line MSTR, followed by the slave clock signal on line SHF, will shift the data stored in the scan path out of the modules via line SDO. The first two data bits out on line SDO are the contents of latches 78, which are not useful in evaluating the results of the test exercise. However, the next three serial data bits received on line SDO constitute the contents of SRLS 34c, 34b, and 34a, in that order, after the exercise of the functional circuitry 31. This information constitutes the logic state of the predetermined points in functional circuitry 31 to which said SRLs 34 are connected, loaded by way of the clock signal on line CLK to each of said SRLs 34. These three data bits can be compared against the three expected (or theoretical) data bits for SRLs 34 for the same exercise responsive to the same test data pattern.

It should be noted that a plurality of test data pattens may be required to be exercised for a proper test of all portions of functional circuitry 31 of module 26a. So long as the same module remains selected, new data may be presented on line SDI while the contents of SRLs 34a through 34c of module 26a are being shifted out onto line SDO. Such activity is shown in FIG. 7 by the signals on line SDI designated as 78b', 78a', 34c', 34b' and 34a'. The scan signal on line SCAN can then again be taken to a "0" state, and the functional circuitry 31 of module 26a again tested with the new data pattern.

After module 26a is tested as desired using the scan paths, the scanning of a "1" logic state into latch 70 of module 26b will incorporate SRLs 34a and 34b of said module 26b into the scan path. Module 26b may have its functional circuitry 31 similarly tested by a plurality of different test data patterns stored in SRLs 34a and 34b. Once module 26b is fully tested as desired, as discussed above, the test and scan signals on lines TEST and SCAN can be taken to a "0" logic state, and the logic circuit can function in the normal manner.

Figure 8:
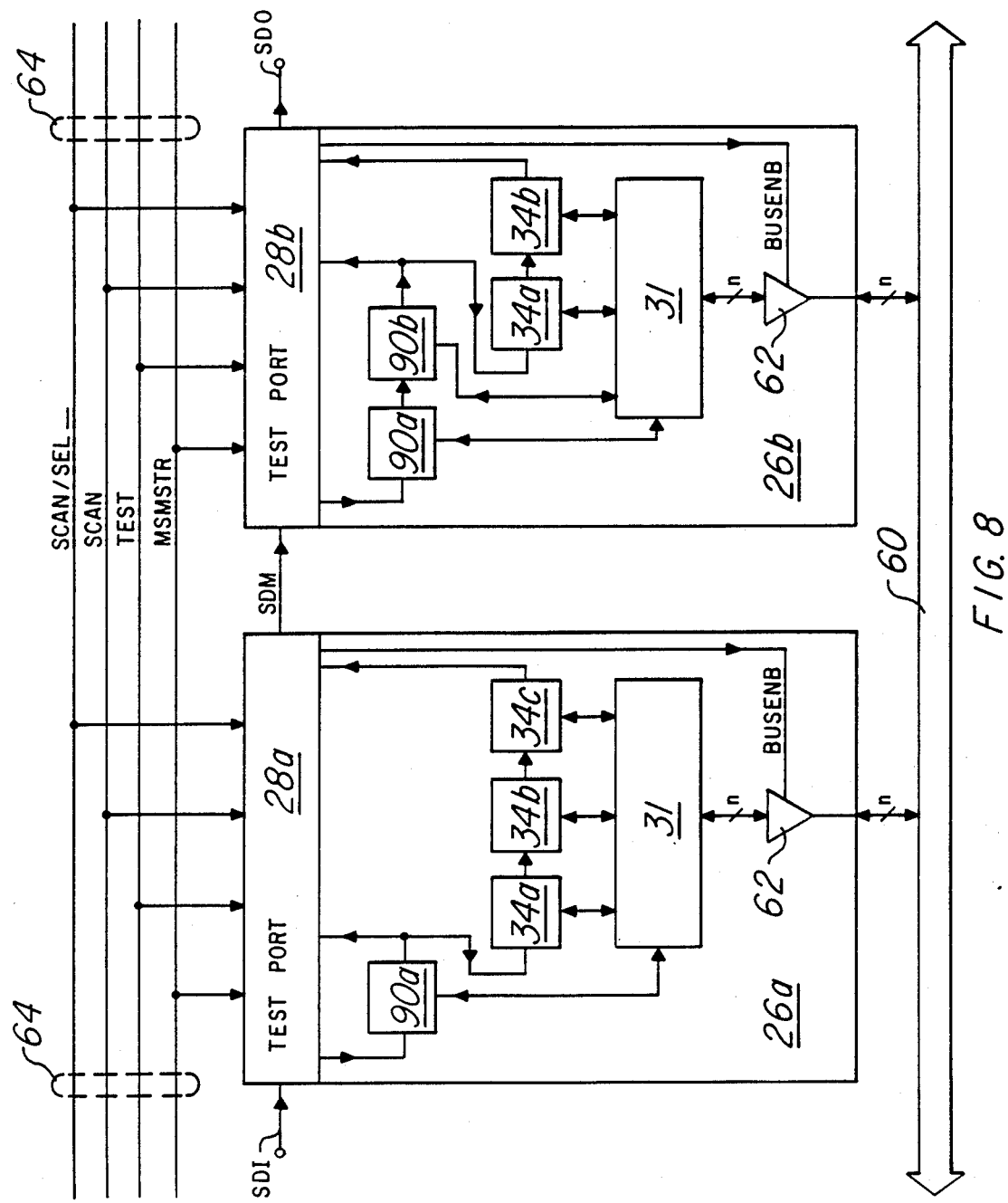
FIG. 8 is a block diagram of two logic modules constructed according to a second embodiment of the invention.

Referring now to FIG. 8, modules 26a and 26b in a logic circuit constructed according to a second embodiment of the invention are illustrated. This embodiment differs from the first embodiment of the invention in that lines MSENB and MSENBI are no longer utilized. This embodiment of the invention muliplexes the select data to be stored in latches 70 of test ports 28a and 28b with the test pattern data stored in SRLs 34 (and latches 78) of test ports 28a and 28b. A fourth line in test bus 64, namely line SCAN/SEL_, controls the multiplexing of the configuration and test data in the manner described hereinbelow.

In addition, FIG. 8 illustrates that the scan paths in each of the modules 26a and 26b contain global SRLs 90, in addition to SRLs 34. Global SRLs 90 are constructed the same as SRLs 34, for example as shown in FIG. 3, and are also responsive to clock signals on lines MSTR, CLK and SHF as are SRLs 34; lines MSTR and SHF are not shown in FIG. 8 for the sake of clarity. For example, module 26a contains a single global SRL 90a, while module 26b contains two global SRLs 90a and 90b. The first global SRL 90a in each of the modules 26a and 26b is connected to the scan data input line for that module (line SDI for module 26a, and line SDM for module 26b). Global SRLs 90 are global in the sense that the output of the last of the global SRLs in the scan path is not only connected to the first SRL 34a in each of the modules 26a and 26b, but is also connected to the associated test port 28 so that the contents of the global SRLs 90 may be scanned without enabling the SRLs 34 in its module. Because of this connection, global SRLs 90 for a given logic module are in the scan path for the logic circuit even if the logic module is not selected, and thus are "global" for the scan and test of any of the logic modules 26. SRLs 34, since they are either utilized or ignored depending upon the selection status of their associated logic module, may therefore be considered "local".

It should be apparent that the incorporation of global SRLs 90 in no way require the use of multiplexed select and test data on lines SDI and SDO, and that the use of multiplexed select and test data on lines SDI and SDO in no way require the incorporation of global SRLs 90. The configuration of FIG. 8 merely illustrates modules 26a and 26b which utilize both features.

Global SRLs 90 are useful for functions performed by functional circuitry 31 of a module 26 which are "global" in nature, such as to control system bus 60, or to otherwise assist in the test of another module 26. For example, the test of module 26a may require that data be presented to inputs of functional circuitry 31 therein (either via system bus 60 or in another way). This requires that another module, such as module 26b, must generate and present the necessary data to module 26a. To serve as a data source, however, module 26b must utilize SRLs 34 to present data to module 26b so that functional circuitry 31 in module 26b is isolated from system bus 60. For the logic circuit of FIG. 6 (without global SRLs 90) to accomplish this, however, would require that module 26b must also be enabled when module 26a is tested, placing all SRLs 34 from both modules 26a and 26b in the scan path. The benefits of reduced test time and modular test generation would of course be reduced by the lengthened scan chain. However, global SRLs 90 in module 26b of FIG. 8, which remain in the scan path when their associated modules 26 are not selected, allow the minimization of the length of the scan chain if needed for test of unselected ones of modules 26. It may be useful in some test applications for both the global SRLs 90 and "local" SRLs 34 of a module 26 other than the one under test to be scanned in, in which case both modules 26 must be selected, as before.

Figure 9:
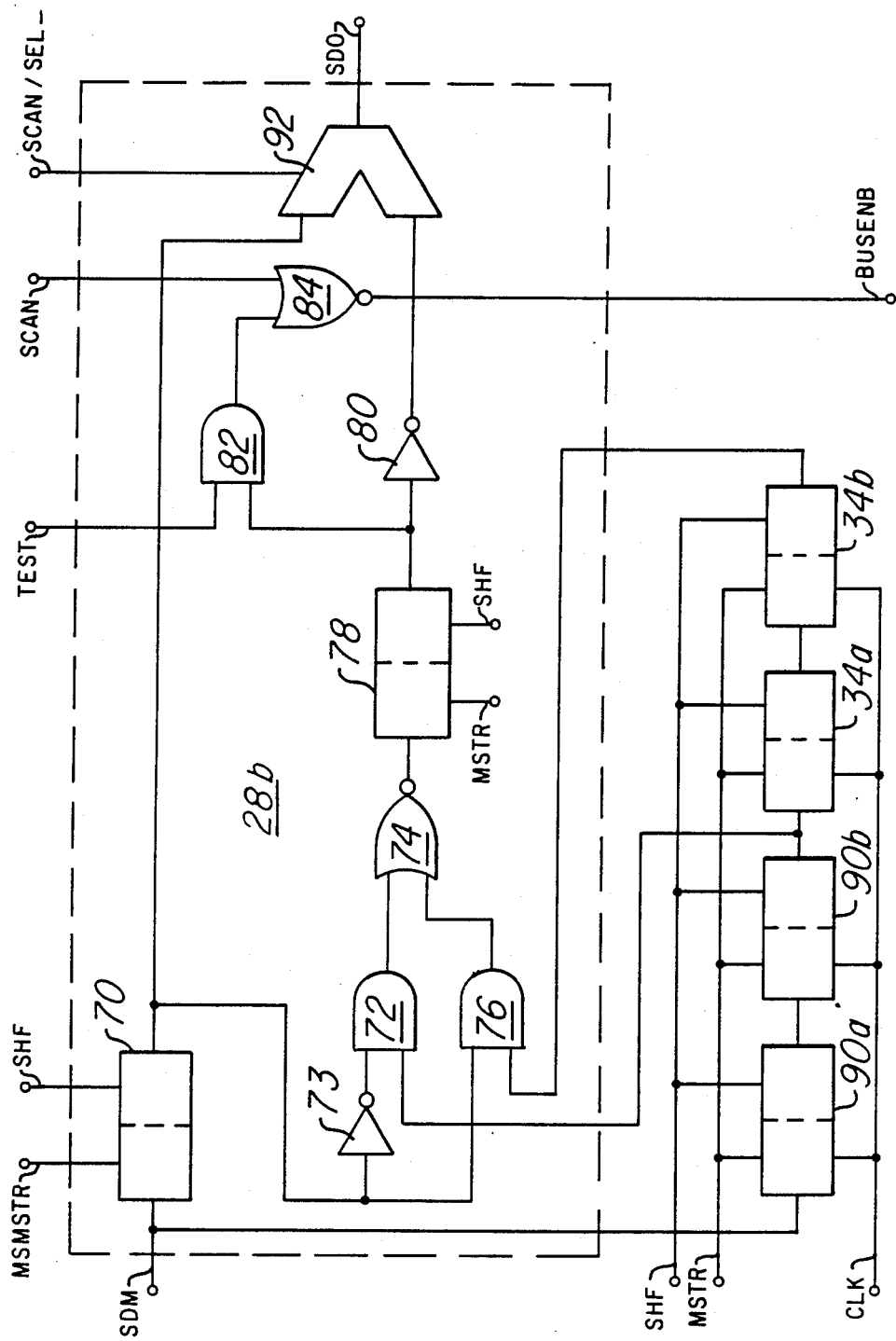
FIG. 9 is an electrical diagram, in schematic form, of one of the modules shown in FIG. 8.

Referring now to FIG. 9, the construction of module 26b as utilized in this second embodiment of the invention is illustrated. It should of course be noted that module 26a of FIG. 8 is similarly constructed as module 26b, with the requisite modifications necessary to account for the different configuration of SRLs 34 and global SRLs 90 therein. The construction and operation of the logic comprised by AND gates 72, 76 and 82, NOR gates 74 and 84, and latch 78 is substantially the same as that described hereinabove relative to FIG. 6. Module 26b of FIG. 9, however, has line SDM connected to the input of latch 70, and to global SRL 90a. SRL 34a is connected to global SRL 90b. Last SRL 34b in the scan path of module 26b is connected to an input of AND gate 76, similar to that of SRL 34c in FIG. 6. Test port 28b further includes multiplexer 92, having first input connected to the output of inverter 80 and having a second input connected to latch 70. The output of multiplexer 92 is connected to line SDO. Multiplexer 92 is a two-input multiplexer as is well known in the art, controllable by its control input to select one of its two inputs to be connected to its output. The control input to multiplexer 92 is connected to the line SCAN/SEL\_ of test bus 64, so that when line SCAN/SEL\_ has a "1" logic state, the output of multiplexer 92 is connected to the output of inverter 80. Conversely, when line SCAN/SEL\_ has a "0" logic state, the output of multiplexer 92 is connected to latch 70. The addition of line SCAN/SEL\_ in test bus 64 thus reduces the number of serial lines interfaced by test ports 28 in modules 26.

Figure 10:
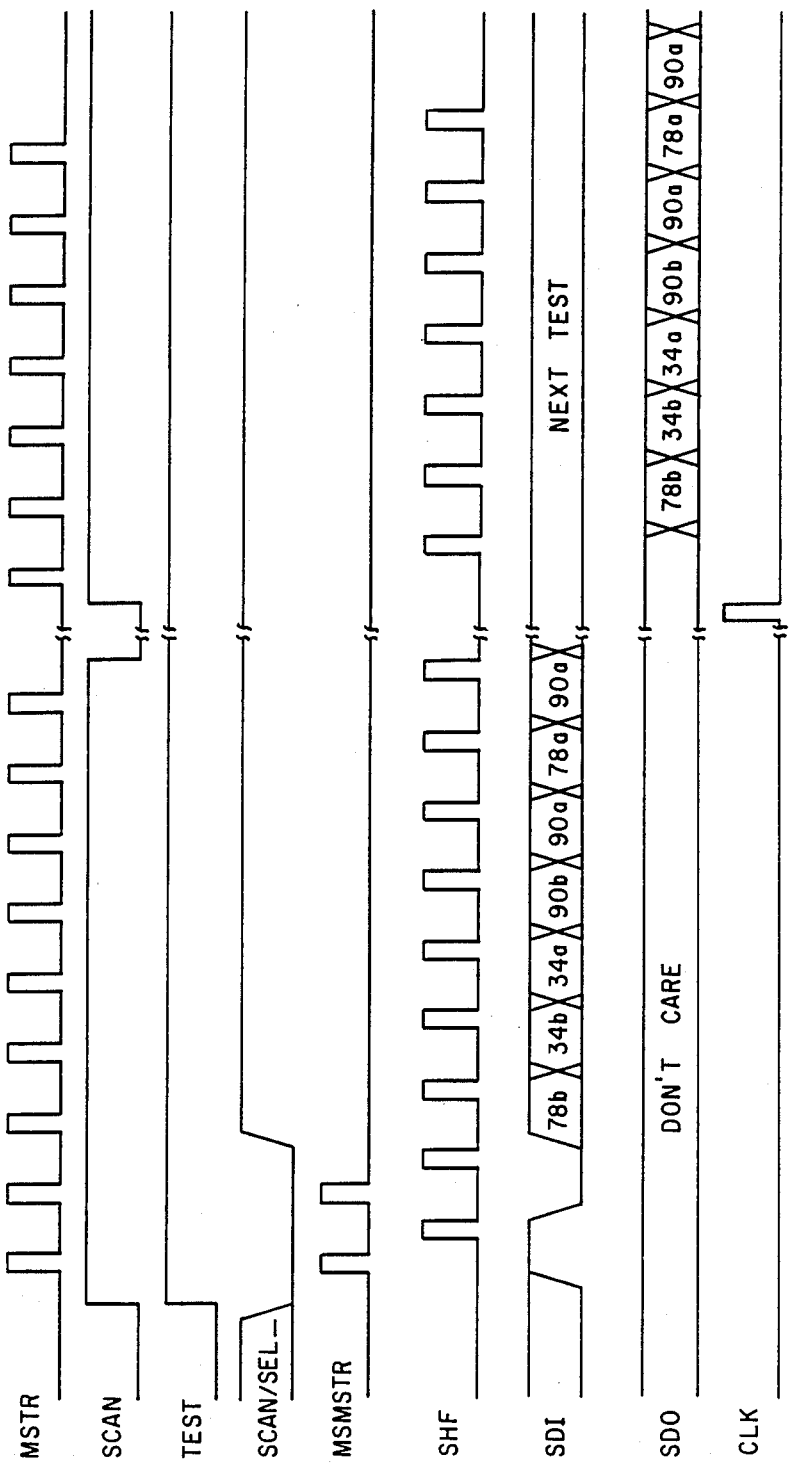
FIG. 10 is a timing diagram illustrating the operation of the test function of the second embodiment of the invention.

FIG. 10 is a timing diagram which illustrates the operation of module 26b shown in FIG. 9, in combination with module 26a as shown in FIG. 8. The configuration data is first scanned into latches 70 by the two pulses of the select signal on line MSMSTR, occurring while line SCAN/SEL\_ is at a "0" logic state. Both the scan signal on line SCAN and the test signal on line TEST are at a "1" logic state at this time. As discussed above, the "0" logic state on line SCAN/SEL\_ causes multiplexer 92 in each of the test ports 28 to connect latch 70 therein to output of multiplexer 92; accordingly, the contents of latch 70 of test port 28a are loaded into latch 70 of test port 28b via line SDM. For purposes of this example, a "1" logic state is loaded into latch 70 of test port 28b and a "0" logic state is loaded into latch 70 of test port 28a.

Line SCAN/SEL\_ is then taken to a "1" logic state, to connect the output of multiplexer 92 to the output of inverter 80 in each test port 28. The test data pattern may then be scanned into the logic circuit from line SDI through the scan path consisting of latch 78 of test port 28b, SRLs 34b and 34a of module 26b, global SRLs 90b and 90a of module 26b, latch 78 of test port 28a, and global SRL 90a of module 26b, in that order. Accordingly, seven pulses of the master clock signal on line MSTR, and the slave clock signal on line SHF, are required in order to load the latches in this scan path, as shown in FIG. 10. Once the scan path is loaded, the scan signal on line SCAN goes to a "0" logic state, during the execution of the test exercise by functional circuitry 31. As in the first embodiment of this invention, the logic state stored in latch 78 will determine whether or not buffer 62 is enabled or disabled during the test exercise. The pulse of the clock singal on line CLK will load SRLs 34 and global SRLs 90 with the logic state of their associated nodes of functional circuitry 31, as before.

After execution of the test exercise, the scan signal on line SCAN of test bus 64 is again taken to a "1" logic state for the scanning out of the results. Seven pulses of the master and slave clock signals on lines MSTR and SHF will present, on line SDO, the contents of latch 78 of test port 28b, SRLs 34b and 34a of module 26b, global SRLs 90b and 90a of module 26b, latch 78 of test port 28a, and global SRL 90a of module 26b, in that order. If an additional test data pattern is to be presented to selected module 26b, this test data pattern may be scanned in from line SDI while the contents of the scan path are being scanned out on line SDO. The scanning in of data on line SDI for the scan path during the scan-out of results is illustrated in FIG. 10. Of course, if another module such as module 26a is to be selected after the test, line SCAN/SEL\_ must again go to a "0" logic state, so that the pulses of the select shift signal on line MSMSTR will scan new configuration data into latches 70 from line SDI.

It is evident from FIG. 10 that, during such time as configuration data is being scanned in to latches 70 from line SDI in the second embodiment shown in FIGS. 8 and 9, configuration data is also being loaded into global SRLs 90, latches 78, and SRLS 34. This is generally of little concern, since the selected scan path is reloaded with known data after selection of the module 26 for test. However, it should be noted that the circuit shown in FIG. 6a for generating the the master clock signals on line MSTR' could be constructed with line SCAN/SEL\_ connected to another input of AND gate 75. This would inhibit global SRLs 90, SRLs 34 and latches 78 from shifting data unless line SCAN/SEL\_ is at a "1" logic state.

Figure 11:
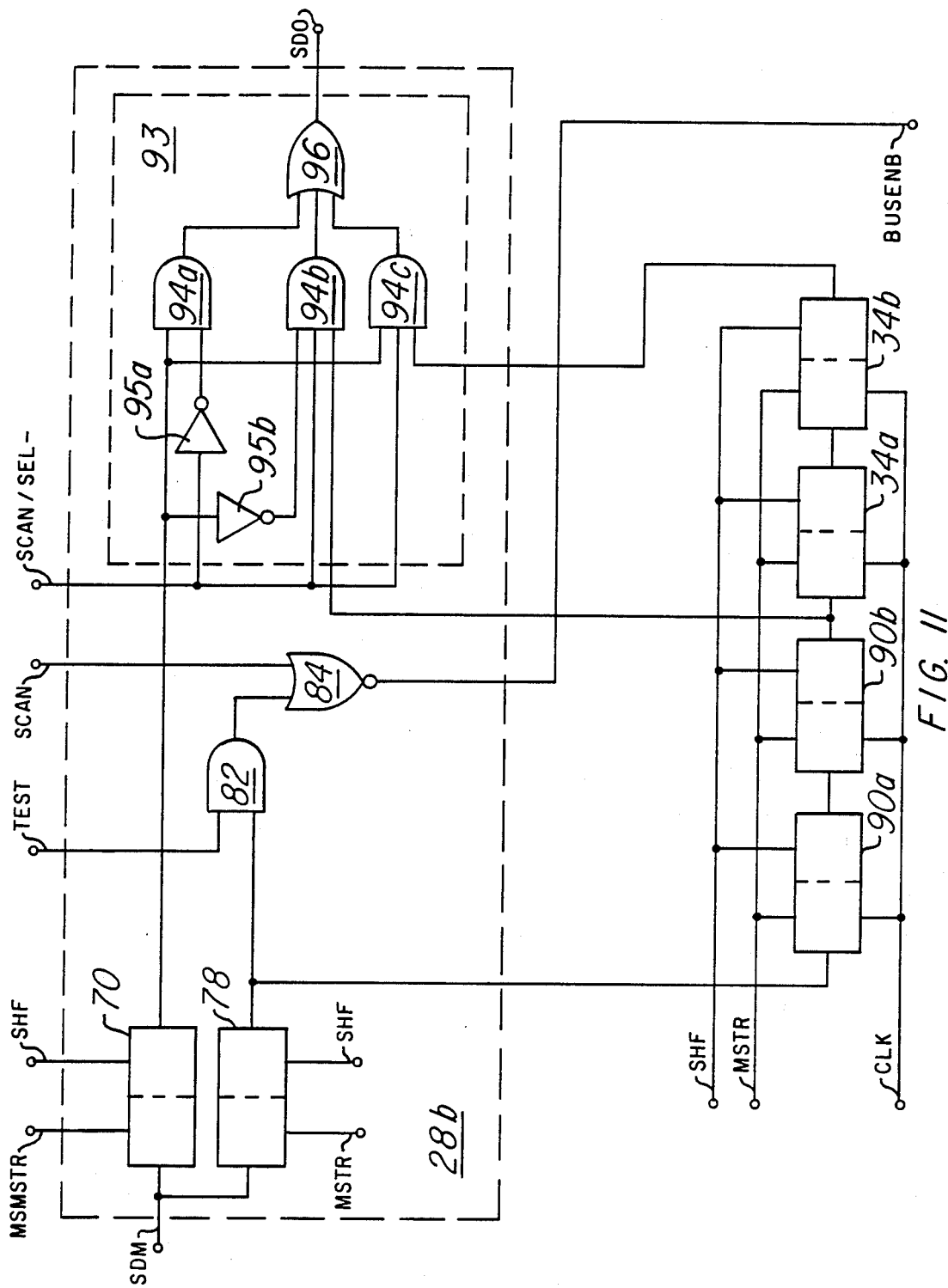
FIG. 11 is an electrical diagram, in schematic form, of another embodiment of a module according to the invention.

Referring to FIG. 11, an additional embodiment of test port 28b and its connection to SRLs 34 and 90 in module 26b of FIG. 9 is illustrated. Similarly as test port 28b of FIGS. 8 and 9, the select and test data are multiplexed on lines SDM and SDO. The embodiment of FIG. 11 reduces the circuitry necessary for the implementation of the multiplexed feature by taking advantage of the different master clock signal lines MSMSTR and MSTR controlling the master stage of latches 70 and 78, respectively. A single multiplexer 93 is utilized for applying to line SDO the contents of latch 70 (during the scaning of select data), the contents of global SRL 90b (during data scan, module 26b not selected), or the contents of local SRL 34b (during data scan, module 26b selected).

In this embodiment, line SDM is connected to the input of latch 70 as before, and also to the input of latch 78. The output of latch 78 generates the signal on line BUSENB as before, via AND gate 82 and NOR gate 84 and controlled by signals TEST and SCAN from bus 64. Multiplexer 93 is a three-input multiplexer, generating the scan output signal on line SDO according to the scan mode, and according to the contents of latch 70 (i.e., according to whether or not the associated module 26b is selected). AND gate 94a receives the output of latch 70 at one input and line SCAN/SEL\_ (inverted via inverter 95a) at another input. AND gate 94b receives one SCAN/SEL\_ at a first input, the contents of latch 70 (inverted by inverter 95b) at a second input, and the contents of last global SRL 90b at a third input. AND gate 94c receives line SCAN/SEL\_ at a first input, the contents of latch 70 at a second input, and the contents of last local SRL 34b at a third input. OR gate 96 receives the outputs of AND gates 94a, 94b and 94c at its inputs, and drives line SDO at its output. Multiplexer 93 is thus operable to present the contents of latch 70 on line SDO when line SCAN/SEL\_ is at a low level, indicating the scanning of select data through test ports 28. In the scan mode, with line SCAN/SEL\_ at a high level, multiplexer 93 will present the contents of the last global SRL 90b on line SDO when the associated module 26b is not selected (i.e., the contents of latch 70 being "0"), or the contents of the last local SRL 34b on line SDO when module 26b is selected (i.e., the contents of latch 70 being "1"). The timing diagram illustrated in FIG. 10 also illustrates the operation of test port 28 of FIG. 11, when incorporated into the logic circuit of FIG. 8.

Although the invention has been described in detail herein with reference to its preferred embodiments, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed hereinbelow.

What is claimed is:

1. A logic circuit, comprising:
   a system bus; and
   a plurality of logic modules, at least one of said modules comprising:
      functional circuitry connected to said system bus;
      a shift input for receiving a shift signal;
      a plurality of data latches, each of said data latches connected to a predetermined location in said functional circuitry, and said plurality of data latches serially interconnected so that the data stored in said data latches shift in series responsive to said shift signal;
      a scan data input, connected to a first one of said plurality of data latches;
      a scan data output;
      a module enable latch for storing a first logic state corresponding to its module being enable, and for storing a second logic state corresponding to its module not being enabled;
      bypass means, connected to said module enable latch, to said scan data output, and to a second one of said plurality of data latches for connecting said second one of said plurality of data latches to said scan data output responsive to said module enable latch storing said first logic state, and for disconnnecting said second one of said plurality of data latches from said scan data output responsive to said module enable latch storing said second logic state; and
      bus control means, connected to said scan data input and to said functional circuitry, for disconnecting said functional circuitry from said system bus responsive to data received at said scan data input.

2. The logic circuit of claim 1, wherein said bus control means comprises:
   a bus control latch, connected to said scan data input, for storing a logic state; and
   buffer means, connected between said functional circuitry and said system bus, and connected to said bus control latch so that said functional circuitry is connected to, or disconnected from, said system bus responsive to the data stored in said bus control latch.

3. The logic circuit of claim 1, wherein said bypass means is further connected to said scan data input, and is for connecting said scan data input to said scan data output responsive to said module enable latch storing its second logic state.

4. The logic circuit of claim 1, wherein said one of said modules further comprises:
   an enable signal input, connected to said module enable latch, for receiving a module enable signal indicating whether or not its module is to be enabled; and
   an enable signal output, connected to said module enable latch for outputting the logic state stored by said module enable latch.

5. The logic circuit of claim 4, wherein the enable signal output of a first one of said modules is connected to the enable signal input of a second one of said modules.

6. The logic circuit of claim 5, wherein said one of said modules further comprises:
   an enable shift input for receiving an enable shift signal, said enable shift input connected to said module enable latch;
   and wherein each module enable latch is loaded with the logic state corresponding to its enable signal input responsive to said enable shift signal.

7. The logic circuit of claim 6, wherein said bypass means comprises:
   a bypass latch having an output connected to said scan output; and
   control logic having a first input connected to said module enable latch, having a second input connected to said second data latch, having a third input connected to said scan input and having an output coupled to said bypass latch so that said bypass latch stores data corresponding to said second data latch responsive to said module enable latch storing said first logic state, and corresponding to said scan data input responsive to said module enable latch storing said second logic state.

8. The logic circuit of claim 7, wherein said bus control means comprises:
   buffer means, connected between said functional circuitry and said system bus, and connected to said bypass latch so that said functional circuitry is connected to, or disconnected from, said system bus responsive to the data stored in said bus control latch.

9. The logic circuit of claim 8, wherein said one of said modules further comprises:
   a scan enable input for receiving a scan enable signal indicating whether or not said logic circuit is in a scan mode, said scan mode corresponding to data being scanned from module to module in said logic circuit;
   and wherein said bypass means further comprises:
      buffer control logic, having a first input connected to said bypass latch, having a second input connected to said scan enable input, and having an output connected to said buffer means, so that said buffer means also disconnects said functional circuitry from said system bus responsive to said scan enable signal indicating that said logic circuit is in said scan mode.

10. The logic circuit of claim 8, wherein said one of said modules further comprises:
    a test control input for receiving a test control signal indicating whether said logic circuit is in a normal operating mode or in a test mode;
    and wherein said bus control means further comprises:
       buffer control logic, having a first input connected to said bypass latch, having a second input connected to said test control input, and having an output connected to said buffer means, so that said buffer means disconnects said functional circuitry from said system bus responsive to said test control signal indicating that said logic circuit is in said test mode, depending upon the data stored in said bypass latch.

11. The logic circuit of claim 7, said bypass means further comprises:
    a gate, having inputs connected to said module enable latch and to said shift signal, and having its output connected to each of said plurality of latches, for disabling said shift signal from causing the data in said data latches from shifting in series therethrough responsive to said module enable latch storing said second logic state.

12. A logic circuit comprised of a plurality of modules, at least one of said modules comprising:
functional circuitry for performing a predetermined logic function;
a shift input for receiving a shift signal;
a scan data input;
a scan data output;
a global data latch, connected to a predetermined location in said functional circuitry;
a local data latch, connected to a predetermined location in said functional circuitry, and connected in series with said global data latch, said scan data input and said scan data output so that the data stored in said global and local data latches shift in series from said scan data input to said scan data output responsive to said shift signal;
a module enable latch for storing a first logic state corresponding to its module being enabled, and for storing a second logic state corresponding to its module not being enabled; and
bypass means, connected to said module enable latch and connected to said local data latch, for disconnecting said local data latch from said series responsive to said module enable latch storing its second data state, so that data shifts from said scan data input through said global data latch to said scan data output responsive to said shift signal.

13. The logic circuit of claim 12, wheren said global data latch is connected to said scan data input;
and wherein said local data latch is connected in series between said global data latch and said scan data output.

14. A logic circuit comprised of a plurality of modules, at least one of said modules comprising:
functional circuitry for performing a predetermined logic function;
a shift input for receiving a shift signal;
a scan data input;
a scan data output;
a plurality of global data latches, each global data latch connected to a predetermined location in said functional circuitry, said plurality of global data latches connected in series so that data shifts therethrough responsive to said shift signal;
a plurality of local data latches, each local data latch connected to a predetermined location in said functional circuitry, said plurality of local data latches connected in series with said plurality of global data latches, with said scan data input and with said scan data output so that the data stored in said global and local data latches shift in series from said scan data input to said scan data output responsive to said shift signal;
a module enable latch for storing a first logic state corresponding to its module being enabled, and for storing a second logic state corresponding to its module not being enabled; and
bypass means, connected to said module enable latch and connected to said plurality of local data latches, for disconnecting said local data latches from said series responsive to said module enable latch storing its second data state, so that data shifts from said scan data input through said plurality of global data latches to said scan data output responsive said shift signal.

15. The logic circuit of claim 14, wherein the first of said global data latches in series is connected to said scan data input;
wherein the last of said global data latches in said series is connected to said first of said local data latches in said series;
and wherein said bypass means is connected to said last of said global data latches in said series, to the last of said local data latches in said series, and to said scan data output, said bypass means for connecting said last of said global data latches to said scan data output responsive to said module enable latch storing its second data state, and for connecting said last of said local data latches to said scan data output responsive to said module enable latch storing its first data state.

16. The logic circuit of claim 15, wherein said bypass means is also for disconnecting said first of said local data latches from said last of said global data latches responsive to said module enable signal storing said second logic state.

17. The logic circuit of claim 16, wherein said bypass means is also for disabling said plurality of data latches from shifting data stored therein responsive to said module enable signal storing said second logic state.

18. A modular logic circuit, wherein at least one of said modules comprises:
functional circuitry;
a scan input;
a data shift input for receiving a data shift signal;
a plurality of data latches, a first of said data latches connected to said scan data input, each of said data latches connected to a predetermined location in said functional circuitry, and said plurality of data latches serially interconnected so that the contents of said data latches shifts in series responsive to said data shift signal;
a module enable latch, connected to said scan input and receiving a module enable load signal, for storing the logic state of said scan data input responsive to said module enable load signal, a first logic state of said scan data input corresponding to the module being selected and a second logic state of said scan data input corresponding to the module not being selected;
a scan output;
an output multiplexer having a first input connected to said module enable latch, having a second input, having an output connected to said scan output, and having a select input for receiving a scan/-select signal, so that said module enable latch is connected to said scan output responsive to said scan/select signal being at a first logic state; and
bypass logic, connected between the last of said data latches in said series and the second input of said output multiplexer, and controlled by said module enable latch so that said last of said data latches is connected to said second input of said output multiplexer responsive to said module enable latch storing said first logic state, and so that said last of said data latches is disconnected from said second input of said output multiplexer responsive to said module enable latch storing said second logic state.

19. The logic circuit of claim 18, wherein the scan output of a first one of said modules is connected to the scan input of a second one of said modules.

20. The logic circuit of claim 18, wherein said bypass logic is also connected between said scan input and the first of said data latches in said series, and is for disconnecting said first data latch from said scan input responsive to said module enable signal storing said second logic state.

21. The logic circuit of claim 18, wherein said one of said modules further comprises:
a global data latch, connected to a predetermined location in said functional circuitry, and connected in series between said scan input and said series of data latches so that data shifts therethrough responsive to said shift signal;
and wherein said bypass logic is also connected to said global data latch, and is for connecting said global data latch to said second input of said output multiplexer responsive to said module enable latch storing said second logic state.

22. The logic circuit of claim 18, wherein said one of said modules further comprises:
a plurality of global data latches, each connected to a predetermined location in said functional circuitry, and connected in a series so that the data stored in said global data latches shift in series responsive to said shift signal, the first global data latch in said series connected to said scan input and the last of said global data latches connected to said first of said data latches in said series;
and wherein said bypass logic is connected to said last of said global data latches so that, responsive to said module enable latch storing said second logic state, a second global data latch of such series is connected to said second input of said output multiplexer.

23. A modular logic circuit, comprising:
a first logic module, comprising:
functional circuitry;
a module scan input;
a module scan output;
a shift input for receiving a shift signal;
a plurality of data latches, each of said data latches connected to a predetermined location in said functional circuitry, and said plurality of data latches serially interconnected so that the data stored in said data latches shift in series responsive to said shift signal, the first data latch in said series connected to said scan data input; a module enable latch for storing a first logic state corresponding to said first module being enabled, and for storing a second logic state corresponding to said first module not being enabled; and
bypass means, connected to said module enable latch, to said module scan output and to the last data latch in said series, for connecting said last data latch to said module scan output responsive to said module enable latch storing said first logic state, and for connecting said module scan input to said module scan output responsive to said module enable latch storing said second logic state; and
a second logic module, comprising:
functional circuitry;
a module scan input, connected to said module scan output of said first module;
a module scan output;
a shift input for receiving a shift signal;
a plurality of data latches, each of said data latches connected to a predetermined location in said functional circuitry, and said plurality of data latches serially interconnected so that the data stored in said data latches shift in series responsive to said shift signal, the second data latch in said series connected to said scan data input;
a module enable latch for storing a first logic state corresponding to said second module being enabled, and for storing a second logic state corresponding to said second module not being enabled; and
bypass means, connected to said module enable latch, to said module scan output and to the last data latch in said series, for connecting said last data latch to said module scan output responsive to said module enable latch storing said first logic state, and for connecting said module scan input to said module scan output responsive to said module enable latch storing said second logic state.

24. The logic circuit of claim 23, wherein said module enable latches in said first and second modules each have an input and an output, and are controlled by said shift signal;
and wherein the input of said module enable latch in said second module is connected to the output of said module enable latch in said first module, so that data shifts through said module enable latches in series responsive to said shift signal.

25. The logic circuit of claim 24, wherein said bypass means in each of said first and second modules comprises:
a bypass latch having an output connected to said module scan output; and
control logic having a first input connected to said module enable latch, having a second input connected to said last data latch in said series, having a third input connected to said scan input and having an output coupled to said bypass latch so that said bypass latch stores data corresponding to said last data latch in said series responsive to said module enable latch storing said first logic state, and stores data corresponding to said module scan input responsive to said module enable latch storing said second logic state.

26. A logic circuit including plural logic modules that each perform certain logical operations, the modules being connected together over a system bus that includes data, address and control leads, said logic circuit comprising:
a test port connected to each logic module, each test port having a serial data input lead, a serial data output lead and plural control leads, the serial data input and output leads of said plural modules being connected together in series, and a test bus of control leads separate from said system bus and connected to the control leads of every test port, control signals on said test bus control leads determining the passage of data at said test ports over said serial input and output leads.

27. The logic circuit of claim 26 in which each test port includes a module enable latch storing the state of a module enable signal.

28. The logic circuit of claim 27 in which said test bus control leads include a select shift lead, a test enable lead and a scan enable lead, the select shift lead connecting to said module enable latch and carrying a select shift signal that loads the state of said module enable signal into said module enable latch, the test enable lead carrying a test enable signal that controls connection of the logic module to the system bus and the scan enable lead carrying a scan enable signal that enables data to be scanned through serial register latches of each logic module without interference by and to said system bus.

29. The logic circuit of claim 27 in which each test port includes a module enable input lead and a module enable output lead both connected to said module enable latch, and the module enable input and output leads of said plural modules are connected together serially.

30. The logic circuit of claim 27 in which said serial data input and output leads connect to said module enable latch and carry multiplexed test pattern data and module enable data.

31. The logic circuit of claim 30 in which said test port includes a multiplexer having one output connected to said serial data output lead, said serial data input lead connecting to said module enable latch and a series of register latches, said multiplexer having one input connected to an output of said module enable latch and another input connected to an output of said series of register latches and said test bus including a scan and select lead connected to said multiplexer to control application of said one and another input to said output.

32. The logic circuit of claim 28 including a buffer connected between each logic module and said system bus for electrically isolating said logic module for said system bus and said buffer being coupled to said test enable lead and said scan enable lead by gating for control by said test enable and scan enable signals.

33. The logic of claim 27 in which each said logic module includes a series of register latches serially connected between said serial data input and output leads and a group of said serial register latches having at least an output connected to said serial data output lead when said module enable signal stored in said module enable latch disables the remainder of said serial register latches from said serial data output lead.

34. The logic circuit of claim 26 including a decoder connected to said test bus control leads and external terminals, said decoder receiving signals from said external terminals and producing signals on said test bus control leads.

35. The logic circuit of claim 26 in which said logic modules include a central processing unit, a system bus controller and an interface.

* * * * *